US 6,657,902 B2

(12) United States Patent
Mizugaki

(10) Patent No.: US 6,657,902 B2
(45) Date of Patent: Dec. 2, 2003

(54) TECHNIQUE OF CONTROLLING NOISE OF POWER SUPPLY IN SEMICONDUCTOR MEMORY DEVICE

(75) Inventor: Koichi Mizugaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/119,841

(22) Filed: Apr. 11, 2002

(65) Prior Publication Data

US 2003/0012060 A1 Jan. 16, 2003

(30) Foreign Application Priority Data

Apr. 18, 2001 (JP) ........................................ 2001-119095

(51) Int. Cl.[7] .............................................. G11C 7/00
(52) U.S. Cl. .............................. 365/189.05; 365/230.08
(58) Field of Search ........................ 365/189.05, 189.09, 365/194, 230.01, 230.03, 230.06, 230.08

(56) References Cited

U.S. PATENT DOCUMENTS 6,028,804 A   2/2000   Leung 6,317,369 B1 * 11/2001 Kubo et al. .................. 365/193
2002/0122346 A1 * 9/2002 Blodgett ...................... 365/233

FOREIGN PATENT DOCUMENTS

JP           A 11-297067         10/1999

* cited by examiner

Primary Examiner—Thong Le
(74) Attorney, Agent, or Firm—Oliff & Berridge, PLC

(57) ABSTRACT

A semiconductor memory device includes: at least one memory cell block including multiple dynamic memory cells arrayed in a matrix; a row address decoder and a column address decoder that select a memory cell in the memory cell block, which is specified by an address including a row address and a column address; an output buffer that causes data to be output from the selected memory cell specified by the address; a preset circuit that presets an output level of the output buffer; and a preset control module that controls an operation of the preset circuit. At every time of outputting data from the memory cell selected by the column address decoder, the output level of the output buffer is preset, prior to output of the data from the selected memory cell by means of the output buffer.

This arrangement effectively prevents the potential noise in a power source of the semiconductor memory device.

17 Claims, 25 Drawing Sheets

Fig. 2

|  | #CS | ZZ | REFRESH MODE (Notes) |
|---|---|---|---|
| OPERATION | L | H | MODE 1 |
| STAND-BY | H | H | MODE 1 |
| SNOOZE (POWER DOWN) | H | L | MODE 2 |

(Notes)
Refresh Mode 1: Refreshing is executed synchronously with an ATD signal after generation of a refresh timing signal in a memory chip.
Refresh Mode 2: Refreshing is executed immediately after generation of a refresh timing signal in a memory chip (input of an address is not required).

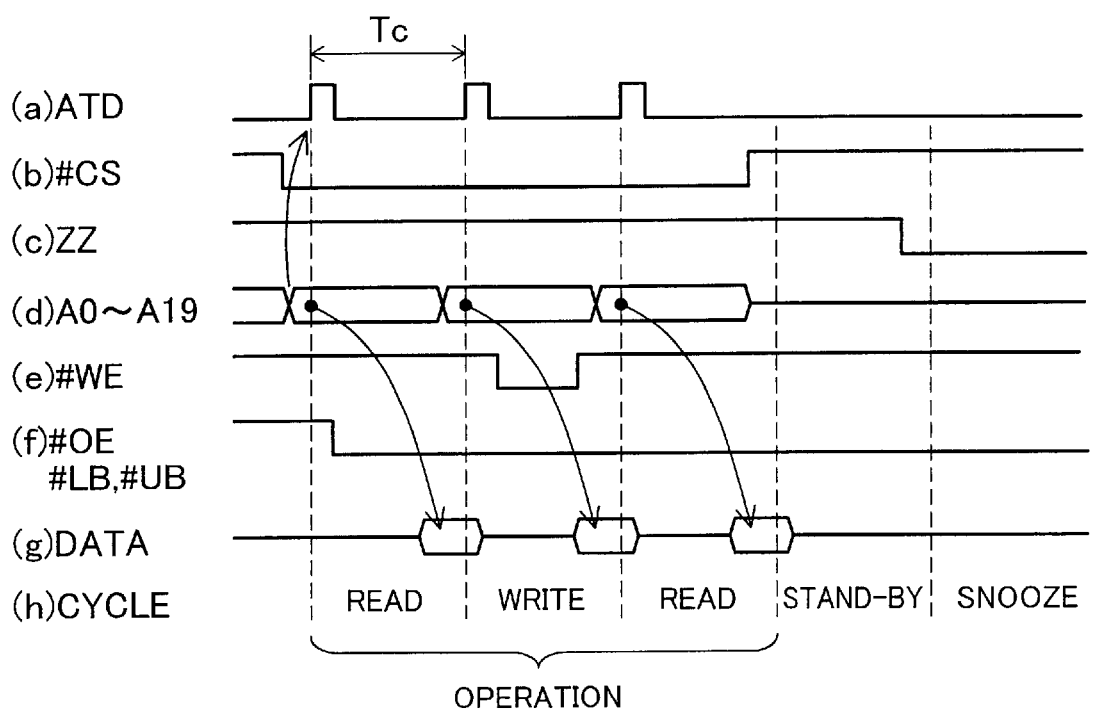
Fig. 3 OUTLINE OF OPERATIONS

TECHNIQUE OF CONTROLLING NOISE OF POWER SUPPLY IN SEMICONDUCTOR MEMORY DEVICE

BACKGROUND OF THE INVENTION

1. Field of the Invention

The present invention relates to a technique of noise reduction in a power source of a semiconductor memory device.

2. Description of the Related Art

Typical examples of the semiconductor memory device include DRAM and SRAM. As is well known, the DRAM is more affordable in price and has a larger capacity than the SRAM, but requires the refreshing operation. The SRAM does not require any refreshing operation and is easily handled, but is more expensive and has a smaller capacity than the DRAM.

A virtual SRAM (called VSRAM or PSRAM) is known as a semiconductor memory device having the advantages of the DRAM and the SRAM. The virtual SRAM has a memory cell array of dynamic memory cells like the DRAM, and includes a refresh controller to perform the internal refreshing operation. An external device (for example, a CPU) connecting with the virtual SRAM can thus gain access to the virtual SRAM (for reading or writing data) without being specifically conscious of the refreshing operation.

In the DRAM, multiple power source terminals are generally provided for each of a positive power source and a negative power source as external power supply terminals for supplying power. This arrangement prevents potential noise in the power source due to a variation in electric current running through the power source. In the SRAM, on the other hand, only one pair of power source terminals are generally provided for the positive power source and the negative power source. The power source terminals of the virtual SRAM typically have the same construction as that of the SRAM. The less number of the power source terminals may cause the virtual SRAM to be rather vulnerable to noise in the power source.

SUMMARY OF THE INVENTION

The object of the present invention is thus to solve the drawback of the prior art semiconductor devices and to provide a technique of preventing potential noise in a power source of a semiconductor memory device, such as a virtual SRAM.

In order to attain at least part of the above and the other related objects, the present invention is directed to a semiconductor memory device, which includes: at least one memory cell block including dynamic memory cells arrayed in a matrix; a row address decoder and a column address decoder that select a memory cell in the memory cell block, which is specified by an address including a row address and a column address; an output buffer that outputs data corresponding to the selected memory cell specified by the address; a preset circuit that presets an output level of the output buffer; and a preset control module that controls an operation of the preset circuit. The preset control module actuates the preset circuit to preset the output level of the output buffer prior to output of the data corresponding to the selected memory cell from the output buffer, at every output of the data corresponding to the memory cell selected by the column address decoder.

Here the operation 'preset the output level' means that the output level of the output buffer is set to a level (intermediate level) between a level representing data '1' and a level representing data '0', prior to output of data from the output buffer.

In this arrangement, the output level of the output buffer is set to the intermediate level, prior to output of data from the output buffer. The variation in output level in the course of data output is accordingly smaller than the variation from the level H to the level L of the variation from the level L to the level H. This arrangement thus effectively prevents potential noise in the power source, due to a variation in output.

In accordance with one preferable application, the preset control module actuates the preset circuit to preset the output level of the output buffer in response to every change of the column address in a consecutive output mode where the row address is fixed and the column address is varied.

In this application, the output level of the output buffer is preset in response to every change of the column address, in the consecutive output mode where the row address is fixed and the column address is varied.

In accordance with another preferable application, the semiconductor memory device further includes an output enable signal input terminal, which receives an output enable signal for defining output state from the output buffer. In the case where the output enable signal is in an output forbid state, the preset control module actuates the preset circuit to preset the output level of the output buffer after the output enable signal is set in an output enable state.

The output enable signal may be set in the output enable state after output of data from the memory cell specified by the address. In the case where the preset operation of the output buffer has already been concluded prior to the setting of the output enable signal in the output enable state to allow output of data from the selected memory cell by means of the output buffer, the output level at the time of the setting may be deviated from the output level at the time of conclusion of the preset operation. The above arrangement desirably prevents such a deviation of the preset output level.

It is preferable that the output level of the output buffer is preset by the preset circuit to a substantially intermediate level between a level representing data '1' and a level representing data '0'.

In this application, the variation in output of the output buffer is substantially half the variation from the level H to the level L or the variation from the level L to the level H. This application thus minimizes the variation in output.

In one preferable embodiment, the semiconductor memory device has multiple memory cell blocks, and multiple row address decoders and column address decoders, which corresponding to the respective memory cell blocks. The address includes a block address for selecting one arbitrary memory cell block among the multiple memory cell blocks. The preset control module actuates the preset circuit to preset the output level of the output buffer prior to output of the data corresponding to the selected memory cell from the output buffer, at every output of the data corresponding to the memory cell selected by the column address decoder in one memory cell block specified by the block address.

In this embodiment, at every output of the data corresponding to the memory cell selected by the column address decoder in one memory cell block specified by the block address, the output level of the output buffer is preset prior to output of the data corresponding to the selected memory cell from the output buffer.

In accordance with still another preferable application, the semiconductor memory device is provided with a pair of power source terminals, one positive power source terminal and one negative power source terminal, as only power supply terminals for supplying power to the semiconductor memory device.

The semiconductor memory device with only one pair of power source terminals is relatively vulnerable to the power supply noise. The semiconductor memory device of the above application, however, effectively prevents the potential noise in the power source.

The technique of the present invention may be actualized by a diversity of applications; for example, a semiconductor memory device, a method of presetting an output buffer in the semiconductor memory device, a semiconductor memory system including the semiconductor memory device and a controller, a method of controlling the semiconductor memory device, and an electronic apparatus including the semiconductor memory device.

BRIEF DESCRIPTION OF THE DRAWINGS

FIG. 2 shows the working status of the memory chip 200 according to the signal levels of a chip select signal #CS and a snooze signal ZZ;

FIG. 3 is a timing chart showing the operations of the memory chip 200;

DESCRIPTION OF THE PREFERRED EMBODIMENTS

Figure 1:
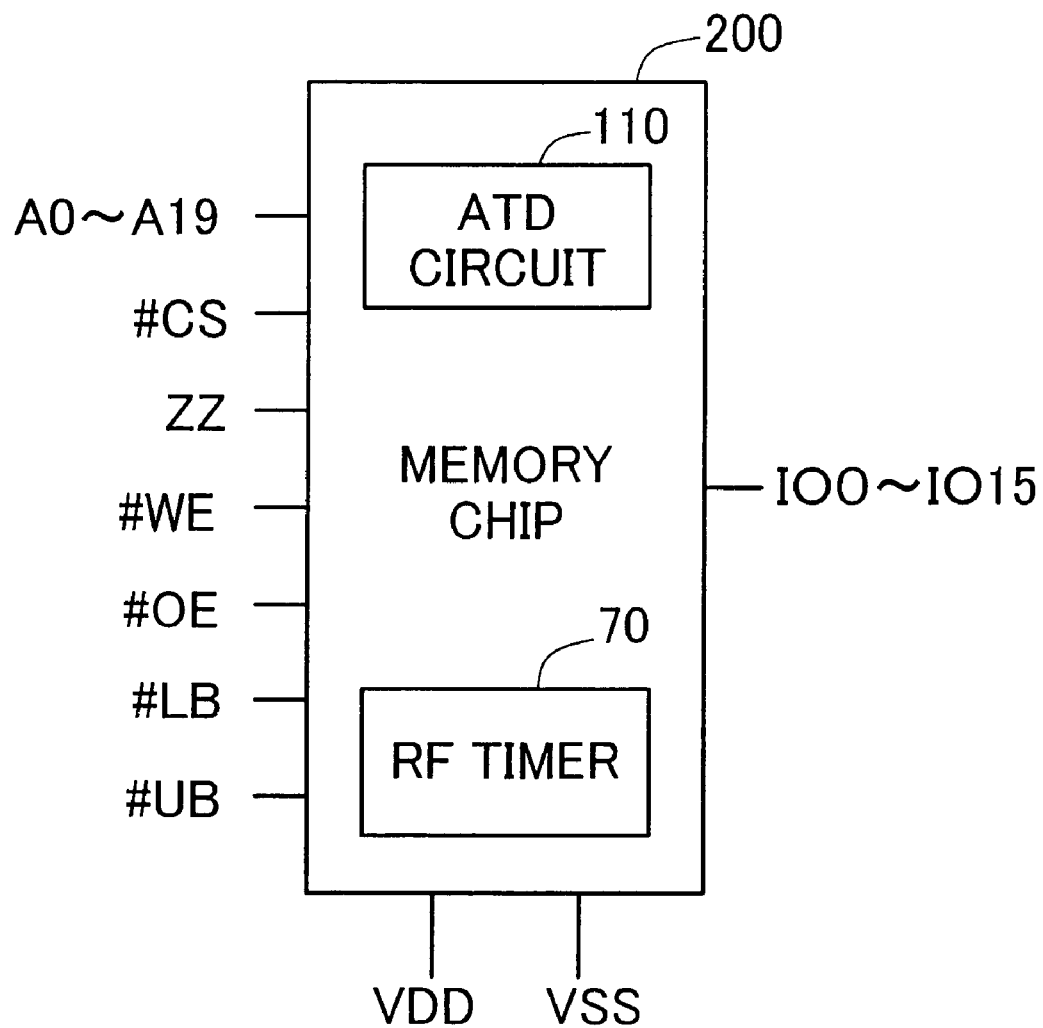
FIG. 1 shows the terminal structure of a memory chip 200 in a first embodiment of the present invention.

Some modes of carrying out the present invention are discussed below as preferred embodiments in the following sequence:

A. First Embodiment
  A1. Terminal Structure of Memory Chip and Outline of Working Status
  A2. General Inner Structure of Memory Chip
  A3. Construction of Access Control Module
  A4. Operations of Access Control Module
  A5. Construction of Data Input-output Buffer
  A6. Construction and Operations of Output Control Circuit
  A7. Construction and Operations of Output Buffer
B. Second Embodiment
C. Application to Electronic Apparatuses
A. First Embodiment
A1. Terminal Structure of Memory Chip and Outline of Working Status FIG. 1 shows the terminal structure of a memory chip 200 in a first embodiment of the present invention. The memory chip 200 has multiple terminals:

A0 through A19: (20) Address input terminals
CS: Chip select input terminal
ZZ: Snooze input terminal
WE: Wright enable input terminal
OE: Output enable input terminal (Output permission signal input terminal)
LB: Lower byte enable input terminal
UB: Upper byte enable input terminal
IO0 through IO15: (16) Input-output data terminals
VDD: Positive power source terminal
VSS: Negative power source terminal In the description hereafter, an identical symbol is applied for both the terminal name and the signal name. The prefix '#' attached to the head of each terminal name (signal name) represents negative logic. Although there are multiple address input terminals A0 through A19 and input-output data terminals IO0 through IO15, they are simplified in the illustration of FIG. 1.

The memory chip 200 is constructed as a virtual SRAM (VSRAM) that is accessible by the same procedure as that for conventional asynchronous SRAMs. Unlike the SRAM, however, the VSRAM uses a dynamic memory cell and requires refreshing in predetermined time periods. A refresh controller including a refresh timer 70 is accordingly built in the memory chip 200. In the specification hereof, data reading and writing operations from an external device (a control device) are referred to as 'external access', and refreshing operations executed by the built-in refresh controller are referred to as 'internal refresh' or simply 'refresh'.

The memory chip 200 is provided with an address transition detection circuit 110, which detects a variation of the input address A0 through A19 by at least one bit. The respective circuits in the memory chip 200 work based on an address transition signal supplied from the address transition detection circuit 110. For example, adjustment of the external access and the internal refresh is based on the address transition signal. Data output control in the case of external access is also based on the address transition signal as described later. In the description hereinafter, the address transition detection circuit 110 is referred to as the 'ATD circuit', and the address transition signal is referred to as the 'ATD signal'.

The chip select signal #CS and the snooze signal ZZ shown in FIG. 1 are used to regulate the working status of the memory chip 200. FIG. 2 shows the working status of the memory chip 200 according to the signal levels of the chip select signal #CS and the snooze signal ZZ. In the specification hereof, 'level H' denotes a level '1', which is one of two levels of a binary signal, whereas 'level L' denotes a level '0'.

When the chip select signal #CS is at the level L (active) and the snooze signal ZZ is at the level H, a read/write operation cycle is activated (hereinafter may simply be referred to as 'operation cycle' or 'read/write cycle'). In the operation cycle, external access is permitted, while internal refresh is executed at adequate timings.

When both of the chip select signal #CS and the snooze signal ZZ are at the level H, a stand-by cycle is activated. In the stand-by cycle, external access is prohibited, and all word lines are inactivated. During the internal refresh, however, a specific word line specified by a refresh address is activated.

When the chip select signal #CS is at the level H (inactive) and the snooze signal ZZ is at the level L, the memory chip 200 shifts into a snooze status (also referred to as 'power-down status'). In the snooze status, all circuits other than those required for the refreshing operation are ceased. The snooze status has extremely small power consumption and is thus suitable for data backup in the memory.

The refreshing operation is executed in a first refresh mode in the operation cycle and in the stand-by cycle, and is executed in a second refresh mode in the snooze status. In the first refresh mode, the refreshing operation starts synchronously with the ATD signal after generation of a refresh timing signal by a refresh timer 70. In the second refresh mode, on the other hand, the refreshing operation starts immediately after generation of the refresh timing signal by the refresh timer 70. The refreshing operation in the second refresh mode is asynchronous with the ATD signal and accordingly does not require input of an address A0 through A19. The memory chip 200 executes refreshing in the suitable refresh mode corresponding to each of the three working statuses.

The address data A0 through A19 shown in FIG. 1 is 20-bit data and specifies an address of 1 mega word. The input-output data IO0 through IO15 is 16-bit data corresponding to 1 word. Namely each value of the address A0 through A19 corresponds to 16 bits (1 word), and allows simultaneous input or output of the 16-bit input-output data IO0 through IO15.

In the operation cycle, a write cycle is activated when the write enable signal #WE is at the level L, whereas a read cycle is activated when the write enable signal #WE is at the level H. Output from the input-output data terminals IO0 through IO15 is allowed when the output enable signal #OE is at the level L. The lower byte enable signal #LB and the upper byte enable signal #UB are control signals for reading or writing only one byte out of the lower byte and the upper byte of 1 word (16 bits). For example, when the lower byte enable signal #LB is set at the level H and the upper byte enable signal #UB is set at the level H, the reading or writing operation is executed for only the lower 8 bits of 1 word.

The positive power source VDD and the negative power source VSS are generally set equal to 2.5 V and 0 V, respectively.

FIG. 3 is a timing chart showing the operations of the memory chip 200. The current working status among the three working statuses (operation, stand-by, snooze) shown in FIG. 2 is specified at adequate timings according to variations of the chip select signal #CS and the snooze signal ZZ. The first three cycles in FIG. 3 are in the operation cycle. In the operation cycle, either of the read operation (read cycle) or the write operation (write cycle) is executed according to the level of the write enable signal #WE. A minimum period Tc of the ATD signal (that is, a minimum period of the variation of the address A0 through A19) corresponds to a cycle time (also referred to as 'cycle period') of this memory chip 200. The cycle time Tc is set in a range of about 50 ns to about 100 ns, for example, in the case of random access.

At the fourth cycle in FIG. 3, the chip select signal #CS has risen to the level H, so that the stand-by cycle starts. At the fifth cycle, the snooze signal ZZ has fallen to the level L, so that the memory chip 200 shifts to the snooze status. No ATD signal is generated during no variation of the address A0 through A19 as shown in FIG. 3(a).

A2. General Inner Structure of Memory Chip

Figure 4:
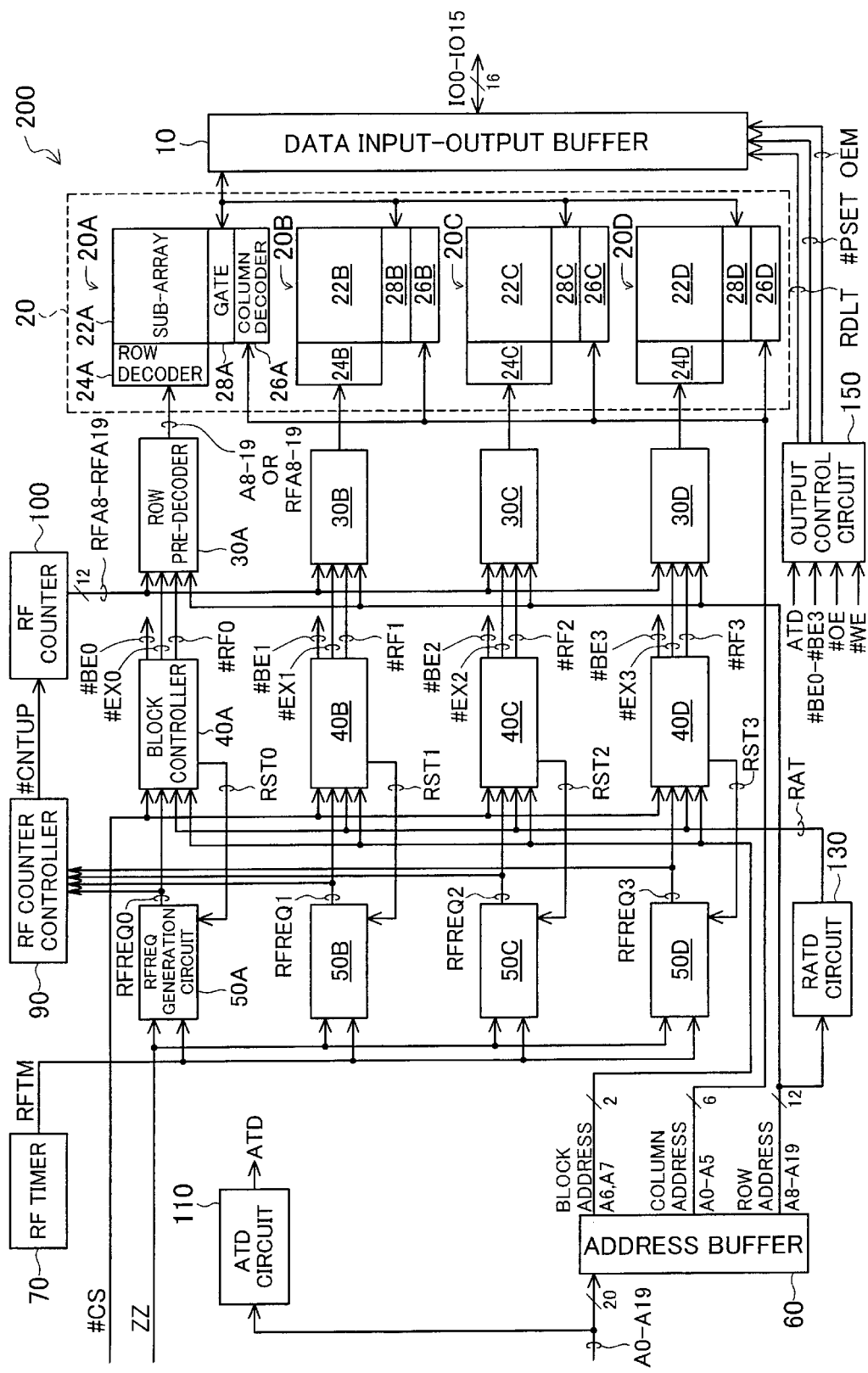
FIG. 4 is a block diagram illustrating the internal structure of the memory chip 200.

FIG. 4 is a block diagram illustrating the internal structure of the memory chip 200. This memory chip 200 has a data input-output buffer 10, a memory cell array 20, and an address buffer 60.

The memory cell array 20 is divided into four blocks 20A through 20D. The first block 20A has a memory cell sub-array 22A, a row decoder 24A, a column decoder 26A, and a gate 28A. The other blocks 20B through 20D have similar constituents. Since the respective blocks 20A through 20D have substantially the same structure, the following description mainly regards the first block 20A and other circuits related thereto.

The structure of each block 20A is similar to that of a typical DRAM memory cell array. The sub-array 22A has a plurality of one-transistor, one-capacitor-type memory cells arranged in a matrix. Each memory cell is connected with a word line and a bit line pair (also referred to as data line pair). The row decoder 24A includes a row driver and activates selected one of multiple word lines in the sub-array 22A according to a given row address. The column decoder 26A includes a column driver and simultaneously selects bit line pairs of 1 word (16 bits) among multiple bit line pairs in the sub-array 22A according to a given column address. The gate 28A includes a reading circuit and a writing circuit and allows data transmission between the data input-output buffer 10 and the sub-array 22A. The block 20A also includes non-illustrated other constituents, such as a pre-charge circuit, a sense-amplifier, and a pre-amplifier.

The address buffer 60 is a circuit for supplying a 20-bit address A0 through A19 transmitted from an external device to the other internal circuits. The lowest 6-bit address A0 through A5 specifies a column address, and the upper 12-bit address A8 through A19 specifies a row address. The intermediate 2-bit address A6 and A7 between the row address and the column address specifies a block address used to select one of the four blocks 20A through 20D. The block address A6 and A7 selects one of the four blocks 20A through 20D, and the column address A0 through A5 and the row address A8 through A19 select memory cells of 1 word (16 bits) in the selected block. Data of 1 word corresponding to the selected memory cells are read or written via the data input-output buffer 10. The external device gains simultaneous access to the memory cells of 1 word in the selected block by input of one address A0 through A19.

Row pre-decoders 30A through 30D, block controllers 40A through 40D, and refresh requirement signal generation circuits 50A through 50D are connected in this sequence to the respective blocks 20A through 20D. The memory chip 200 also includes the refresh timer 70, a refresh counter controller 90, a refresh counter 100, the ATD (address transition detection9 circuit 110, and an RATD (row address transition detection) circuit 130.

The ATD circuit 110 detects a variation of the 20-bit address A0 through A19 given from the external device by at least one bit, and generates the ATD signal as shown in FIG. 3(a) in response to the detected variation.

Figure 5:
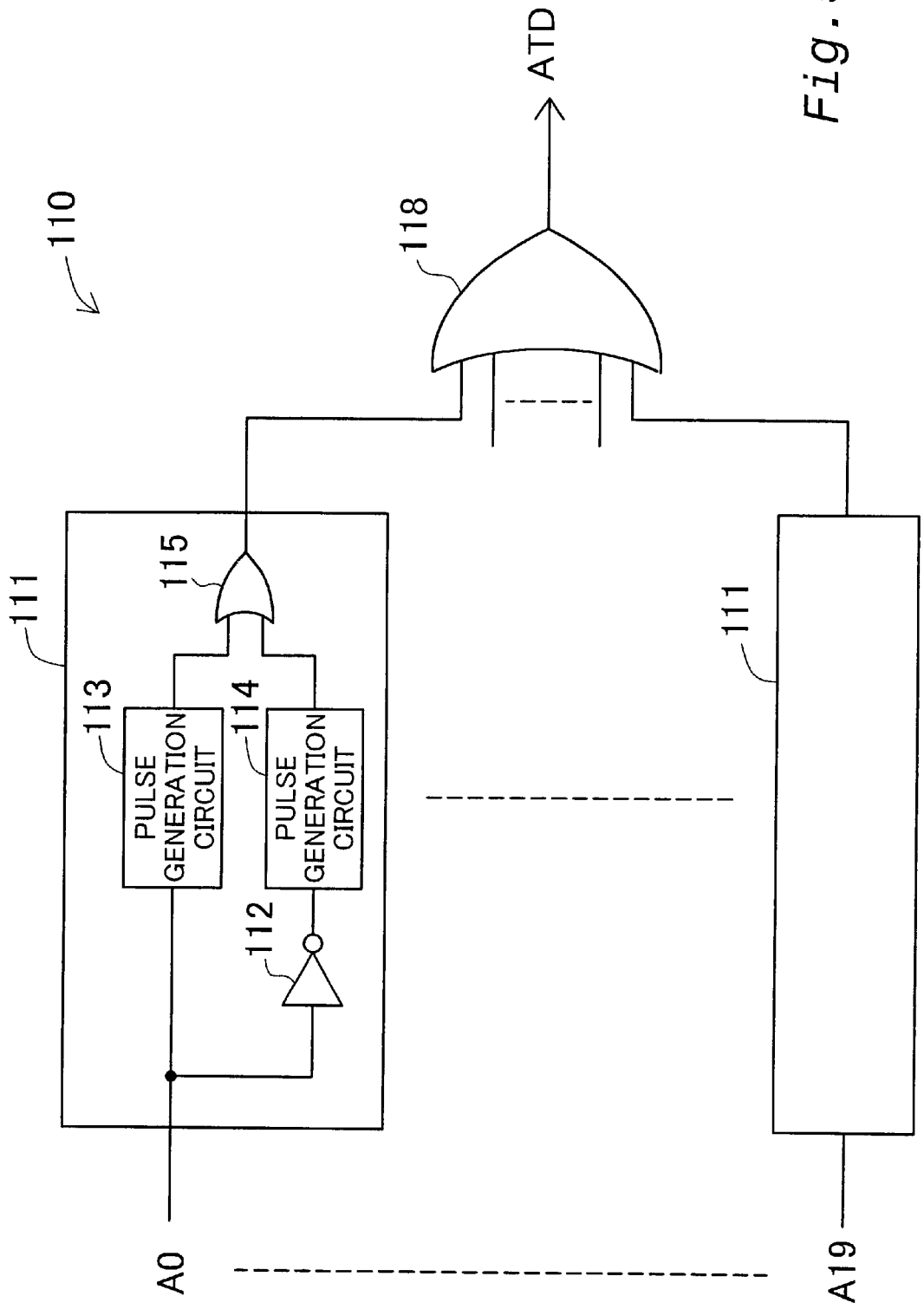
FIG. 5 is a block diagram illustrating the internal structure of an ATD circuit 110.

FIG. 5 is a block diagram illustrating the internal structure of the ATD circuit 110. The ATD circuit 110 includes 20 transition detection circuits 111 corresponding to the respective bits of the 20-bit address A0 through A19 and a 20-input OR gate 118. Each of the transition detection circuits 111 has an inverter 112, two pulse generation circuits 113 and 114, and an OR gate 115. A one-shot multi vibrator is, for example, applied for the pulse generation circuits 113 and 114.

The first pulse generation circuit 113 generates one pulse having a predetermined pulse width according to a rising edge of the address bit A0. The inverter 112 and the second pulse generation circuit 114 generate one pulse having a predetermined pulse width according to a falling edge of the address bit A0. One pulse is accordingly output from the OR gate 115 at each of the rising edge and the falling edge of the address bit A0. Similar pulse output is observed with regard to the other address bits A1 through A19.

The 20-input OR gate 118 receives the outputs of the 20 transition detection circuits 111. With a variation in level of at least one bit among the 20-bit address A0 through A19, a pulse ATD signal is output from the OR gate 118.

The ATD circuit 110 may have any construction as long as it can detect a variation of the 20-bit address A0 through A19 given from the external device by at least one bit and generate the ATD signal shown in FIG. 3(a) in response to the detected variation.

The refresh timer 70 shown in FIG. 4 is a circuit of generating a refresh timing signal RFTM at every fixed refresh period. A ring oscillator is, for example, applied for the refresh timer 70. The refresh period is set, for example, equal to about 32 μs.

The refresh requirement signal generation circuits 50A through 50D respectively generate refresh requirement signals RFREQ0 through RFREQ3, which correspond to the respective blocks 20A through 20D, in response to the refresh timing signal RFTM generated by the refresh timer 70. The refresh requirement signals RFREQ0 through RFREQ3 are respectively supplied to the corresponding block controllers 40A through 40D.

The block controllers 40A through 40D receive the block address A6 and A7 given from the external device, as well as the refresh requirement signals RFREQ0 through RFREQ3. The refresh requirement signals RFREQ0 through RFREQ3 require start of the refreshing operation in the corresponding four blocks 20A through 20D. In the operation cycle, the block address A6 and A7 specifies the destination of the required external access among the four blocks 20A through 20D. The block controllers 40A through 40D accordingly adjust the external access and the internal refresh with regard to the four blocks in response to these signals RFREQ0 through RFREQ3 and the address A6 and A7. A concrete procedure of the adjustment sets the output levels of external access execution signals #EX0 through #EX3 and refresh execution signals #RF0 through #RF3 corresponding to the four blocks.

The respective row pre-decoders 30A through 30D select either one of the row address A8 through A19 given from the external device and a refresh address RFA8 through RFA19 given from the refresh counter 100 according to the levels of the external access execution signals #EX0 through #EX3 and the refresh execution signals #RF0 through #RF3, and supply the selected address to the row decoders 24A through 24D. Each row pre-decoder independently carries out the selection out of the two addresses A8 through A19 and RFA8 through RFA19. For example, when requirement of the refreshing operation is given with the requirement of external access to the first block 20A, the first row pre-decoder 30A selects the row address A8 through A19 and supplies the selected row address A8 through A19 to the first block 20A, while the other row pre-decoders 30B through 30D respectively select the refresh address RFA8 through RFA19 and supply the selected refresh address RFA8 through RFA19 to the corresponding blocks 20B through 20D. The first row pre-decoder 30A supplies the refresh address RFA8 through RFA19 to the first block 20A after conclusion of the external access to the first block 20A.

The structures and the operations of the refresh requirement signal generation circuits 50A through 50D, the block controllers 40A through 40D, and the row pre-decoders 30A through 30D will be discussed later.

The refresh counter controller 90 detects conclusion of the refreshing operation in all of the four blocks 20A through 20D according to the same refresh address RFA8 through RFA19. The detection is implemented by checking the variation in signal level of the four refresh requirement signals RFREQ0 through RFREQ3. On conclusion of the refreshing operation in the four blocks 20A through 20D, the refresh counter controller 90 supplies a count up signal #CNTUP to the refresh counter 100. The refresh counter 100 counts up the value of the refresh address RFA8 through RFA19 by one in response to this count up signal #CNTUP.

An output control circuit 150 controls the output operations of the data input-output buffer 10 in response to the write enable signal #WE, the output enable signal #OE, and column access enable signals #BE0 through #BE3 of the respective blocks. The output control circuit 150 also receives the upper byte enable signal #UB and the lower byte enable signal #LB, although they are omitted from the illustration for convenience of explanation. The details of the output control circuit 150 will be discussed later.

The memory chip 200 has a controller for controlling the working status of the internal circuits in response to the chip select signal #CS and the snooze signal ZZ and a controller for controlling the input status in response to the various enable signals #WE, #OE, #UB, and #LB, in addition to the circuit elements shown in FIG. 4, although they are omitted from the illustration of FIG. 4 as a matter of convenience.

The data input-output buffer 10 and the address buffer 60 shown in FIG. 4 respectively correspond to the data input-output module and the address input module of the present invention. The circuit elements of FIG. 4 (30A through 30D, 40A through 40D, 50A through 50D, 70, 90, 100, 110, 130, and 150) other than the data input-output buffer 10, the address buffer 60, and the memory cell array 20 control activation of the word lines in the memory cell array 20 and selection of the bit line pairs, and correspond to the access control module of the present invention.

The access control module also functions as the refresh control module for controlling the refreshing operations of the memory cell array 20. Especially the circuit structure consisting of the row pre-decoders 30A through 30D, the block controllers 40A through 40D, and the refresh requirement signal generation circuits 50A through 50D exerts the function of an adjustment circuit for adjusting the internal refresh and the external access.

A3. Construction of Access Control Module

Figure 6:
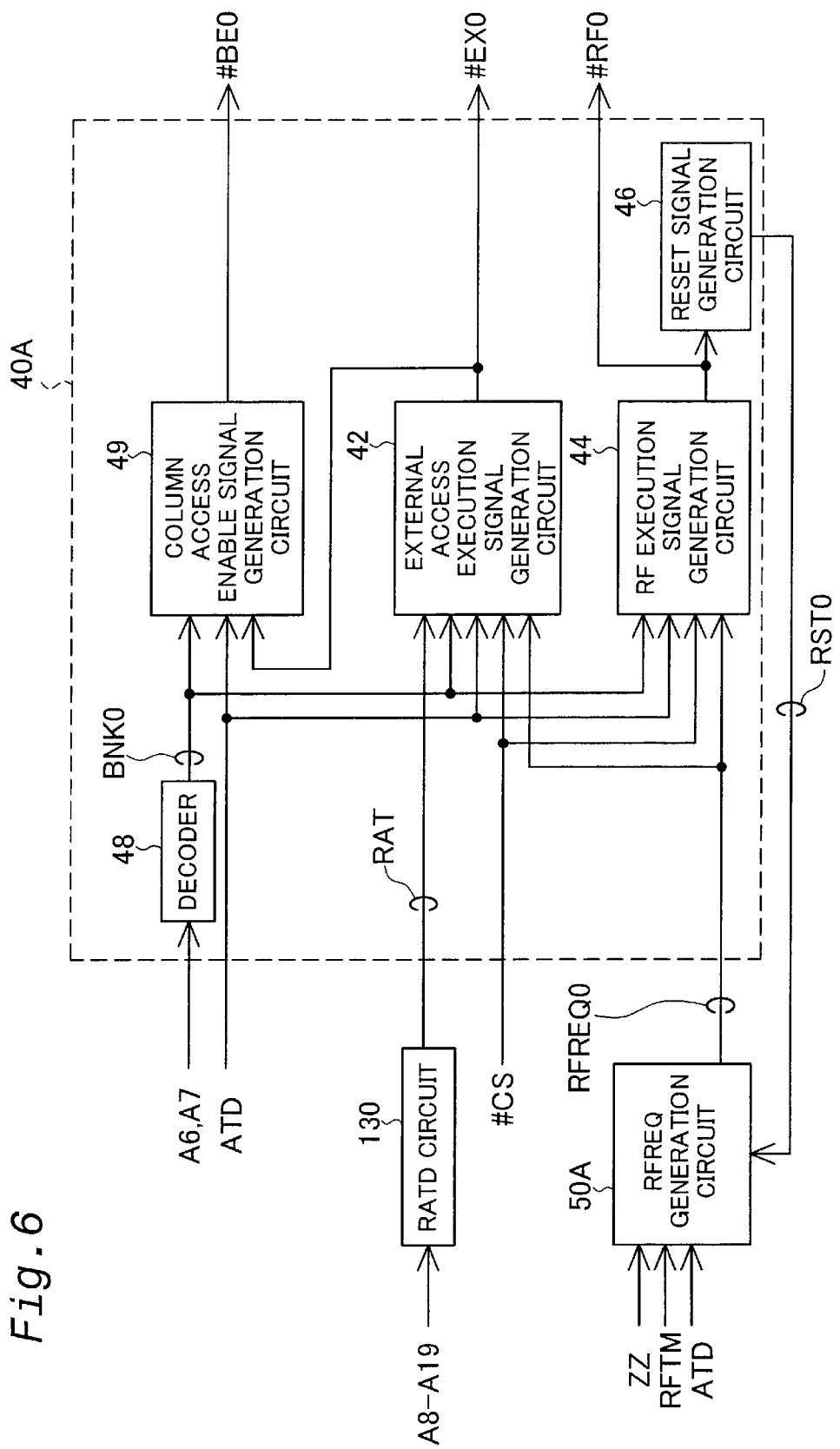
FIG. 6 is a block diagram illustrating the internal structure of the first block controller 40A shown in FIG. 4.

FIG. 6 is a block diagram illustrating the internal structure of the first block controller 40A shown in FIG. 4. The other block controllers 40B through 40D have similar construction to that of FIG. 6.

The block controller 40A includes a decoder 48 that generates a block selection signal BNK0 representing selection of the first block 20A, an external access execution signal generation circuit 42 that generates the external access execution signal #EX0 with regard to the first block 20A, a column access enable signal generation circuit 49 that generates the column access enable signal #BE0 with regard to the first block 20A, a refresh execution signal generation circuit 44 that generates the refresh execution signal #RF0 with regard to the first block 20A, and a reset signal generation circuit 46 that generates a reset signal RST0 in response to the refresh execution signal #RF0.

The decoder 48 gives an output of the level H when the value of the supplied block address A6 and A7 is equal to '0' representing the first block 20A, while otherwise giving an output of the level L.

The external access execution signal generation circuit 42 and the refresh execution signal generation circuit 44 respectively receive the chip select signal #CS, the block selection signal BNK0, the ATD signal, and the refresh requirement signal RFREQ0 given from the refresh requirement signal generation circuit 50A. The external access execution signal generation circuit 42 also receives a row address transition signal RAT (hereinafter referred to as 'RAT signal') given from the row address transition detection circuit 130 (hereinafter may be referred to as the 'RATD circuit'). The column access enable signal generation circuit 49 receives the ATD signal, the external access execution signal #EX0 given from the external access execution signal generation circuit 42, and the block selection signal BNK0 given from the decoder 48.

The refresh requirement signal generation circuit 50A receives the snooze signal ZZ, the refresh timing signal RFTM, and the ATD signal. The refresh requirement signal generation circuit 50A immediately raises the refresh requirement signal RFREQ0 to the level H in response to a rising edge of the refresh timing signal RFTM when the snooze signal ZZ is at the level L (that is, in the snooze status). When the snooze signal ZZ is at the level H (that is, either in the operation cycle or in the stand-by cycle), on the other hand, the refresh requirement signal generation circuit 50A raises the refresh requirement signal RFREQ0 to the level H in response to a rising edge of the ATD signal generated after a rise of the refresh timing signal RFTM.

The row address transition detection circuit (RATD circuit) 130 detects a variation of the 12-bit row address A8 through A19 given from the external device by at least one bit, and outputs the RAT signal in response to the detected variation. The RATD circuit 130 has similar construction to that of the ATD circuit 110 shown in FIG. 5, and receives only the row address A8 through A19 out of the address A0 through A19. As shown in FIG. 4, this RAT signal is supplied to the four block controllers 40A through 40D.

Figure 7:
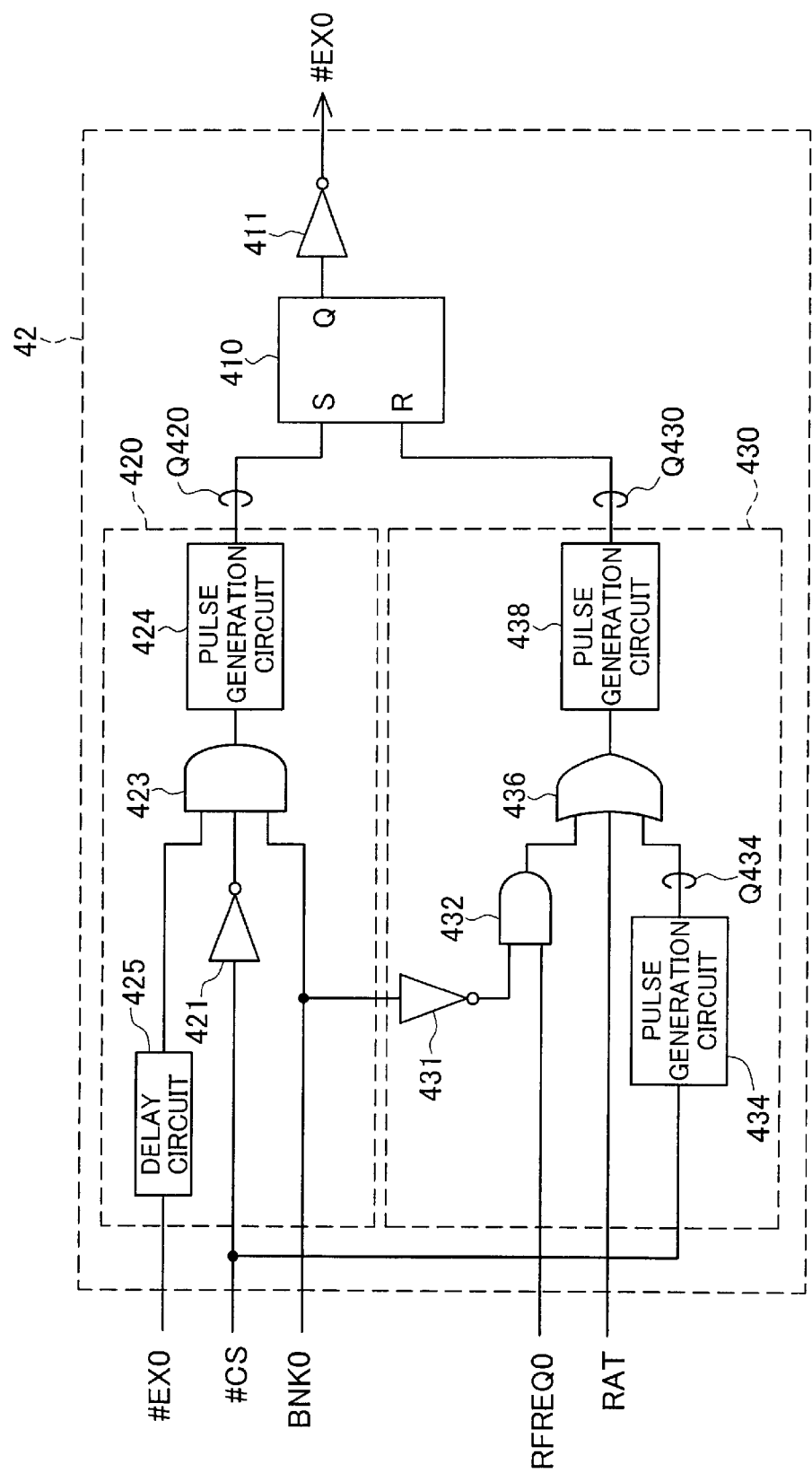
FIG. 7 is a block diagram illustrating the internal structure of the external access execution signal generation circuit 42 shown in FIG. 6.

FIG. 7 is a block diagram illustrating the internal structure of the external access execution signal generation circuit 42 shown in FIG. 6. The external access execution signal generation circuit 42 includes an RS latch 410, an inverter 411, a set signal generation circuit 420, and a reset signal generation circuit 430. An output signal Q420 from the set signal generation circuit 420 is input into a set terminal S of the RS latch 410, whereas an output signal Q430 from the reset signal generation circuit 430 is input into a reset terminal R of the RS latch 410.

The set signal generation circuit 420 includes a delay circuit 425, an inverter 421, a 3-input AND gate 423, and a pulse generation circuit 424. The 3-input AND gate 426 receives the external access execution signal #EX0 delayed by a delay time set in the delay circuit 425, the chip select signal #CS inverted by the inverter 421, and the block selection signal BNK0 output from the decoder 48. The output of the AND gate 423 is given to the pulse generation circuit 424.

The set signal generation circuit 420 determines whether or not the external access is required to the first block 20A corresponding to the first block controller 40A. The set signal generation circuit 420 determines requirement of the external access to the block 20A and supplies the pulse signal Q420 to the set terminal S of the RS latch 410, when the chip select signal #CS is at the level L (active), the delayed output of the external access execution signal #EX0 is at the level H, the value of the block address A6 and A7 is equal to '0', and the block selection signal is at the level H. The RS latch 410 and the inverter 411 set the external access execution signal #EX0 active (at the level L) in response to the pulse signal Q420. When the external access execution signal #EX0 is active (at the level L), the word line specified by the row address A8 through A19 in the block 20A (see FIG. 4) is activated for execution of external access.

The reset signal generation circuit 430 includes an inverter 431, an AND gate 432, a 3-input OR gate 436, and two pulse generation circuits 434 and 438. The AND gate 432 receives the block selection signal BNK0 inverted by the inverter 431 and the refresh requirement signal RFREQ0. The first pulse generation circuit 434 generates a pulse at a rising edge of the chip select signal #CS. The 3-input OR gate 436 receives the output signal of the AND gate 432, the RAT signal, and the output signal of the first pulse generation circuit 434. The output of the OR gate 436 is given to the second pulse generation circuit 438.

The reset signal generation circuit 430 supplies the pulse signal Q430 to the reset terminal R of the RS latch 410 in any of the following three cases: (1) in response to a refresh requirement under the condition of no requirement of the external access to the first block 20A; (2) in response to a variation in row address A8 through A19; and (3) in response to a rise of the chip select signal #CS to the level H (inactive). The RS latch 410 and the inverter 411 set the external access execution signal #EX0 inactive (at the level H) in response to the pulse signal Q430.

In the set signal generation circuit 420, the delayed output of the external access execution signal #EX0 is input into the AND gate 423, because of the following reason. It generally takes some time to inactivate the active word line. Only one word line can be activated at a time in one block. In order to activate another word line in the same block, a wait time (preparation period) should be set to inactivate the active word line. In the case where the same block is selected after the external access execution signal #EX0 is reset to the level H (inactive) by the variation of the row address A8 through A19, it is required to delay a fall of the external access execution signal #EX0 to the level L (active) until inactivation of the word line activated in the previous cycle is completed. The external access execution signal #EX0 is accordingly delayed before being input into the AND gate 423. This delays the time for new setting of the same external access execution signal #EX0 to the level L (active).

The refresh execution signal generation circuit 44 shown in FIG. 6 determines whether or not the external access is required to the first block 20A and sets the status (level) of the refresh execution signal #RF0. The refresh execution signal #RF0 is set active (at the level L) in response to a refresh requirement under the condition of no requirement of the external access to the block 20A. When the refresh execution signal #RF0 is active (at the level L), the word line specified by the refresh address RFA8 through RFA19 in the block 20A (see FIG. 4) is activated and the refreshing operation is performed in all the memory cells on the activated word line. The refresh execution signal #RF0 is set inactive (at the level H) when there is no requirement of the external access to the block 20A nor refresh requirement.

When there is a requirement of the external access to the block 20A, the refresh execution signal #RF0 is set inactive (at the level H) even in the presence of a refresh requirement. The refresh execution signal #RF0 is kept inactive (at the level H) until the external access to the block 20A is concluded, and is set active (at the level L) after conclusion of the external access. In response to setting the refresh execution signal #RF0 active (at the level L), the refreshing operation starts in the block 20A.

The reset signal generation circuit 46 shown in FIG. 6 generates the short-pulse reset signal RST0 in response to a rising edge of the refresh execution signal #RF0. A one-shot multi vibrator is, for example, applicable for the reset signal generation circuit 46. The refresh requirement signal generation circuit 50A returns the refresh requirement signal RFREQ0 to the level L in response to the reset signal RST0 supplied from the reset signal generation circuit 46. This cancels the refresh requirement to the block 20A.

Figure 8:
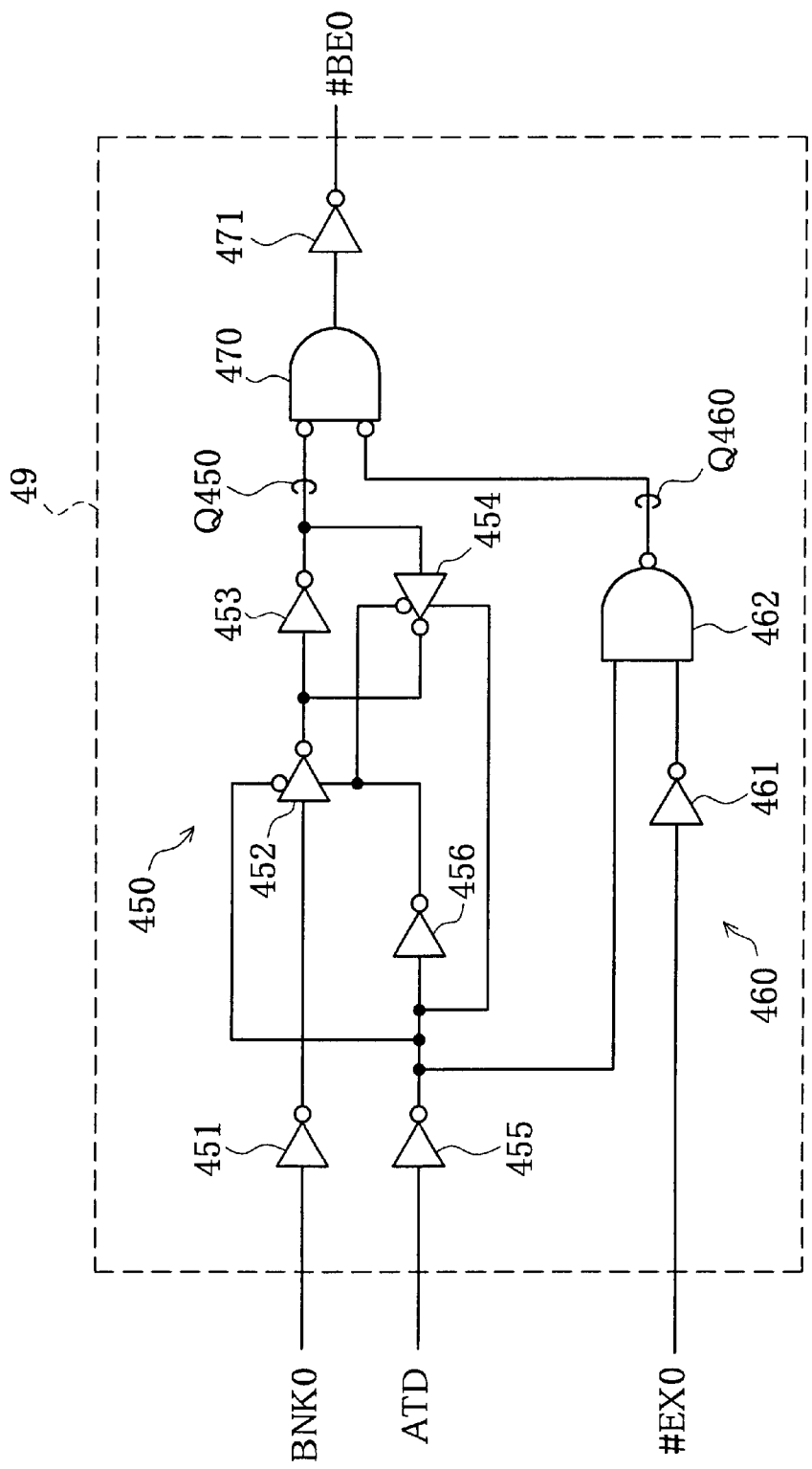
FIG. 8 is a block diagram illustrating the internal structure of the column access enable signal generation circuit 49 shown in FIG. 6.

FIG. 8 is a block diagram illustrating the internal structure of the column access enable signal generation circuit 49 shown in FIG. 6. The column access enable signal generation circuit 49 includes a block selection detection circuit 450, an external access pulse signal circuit 460, a negative-input AND gate 470, and an inverter 471. The negative-input AND gate 470 receives an output Q450 of the block selection detection circuit 450 and an output Q460 of the external access pulse signal circuit 460.

The block selection detection circuit 450 inverts the block selection signal BNK0 by means of three inverters, that is, an inverter 451, a three-state inverter 452, and an inverter 453, and outputs the inverted block selection signal. The output Q450 of the block selection detection circuit 450 is feedback input of the inverter 453 by the function of a three-state inverter 454. Each of the three-state inverters 452 and 454 has two control input terminals and functions as an inverter when the positive input control terminal is at the level H and the negative input control terminal is at the level L, while blocking the output when the positive input control terminal is at the level L and the negative input control terminal is at the level H. The ATD signal inverted twice by two inverters 455 and 456 is input into the positive input control terminal of the first three-state inverter 452, whereas the ATD signal inverted once by the inverter 455 is input into the negative input control terminal. The ATD signal inverted once by the inverter 455 is input into the positive input control terminal of the second three-state inverter 454, whereas the ATD signal inverted twice by the two inverters 455 and 456 is input into the negative input control terminal. The block selection detection circuit 450 constructs a latch circuit using the ATD signal as a clock, and stably detects a variation in block selection signal BNK0 to supply the detection to the negative-input AND gate 470.

A NAND gate 462 of the external access pulse signal circuit 460 receives the inversion of the external access execution signal #EX0 by an inverter 461 and the inversion of the ATD signal by the inverter 455. The external access pulse signal 460 accordingly outputs a signal substantially equivalent to the inversion of the ATD signal as the output Q460 when the external access execution signal #EX0 is at the level L (active).

The negative-input AND gate 470 and an inverter 471 sets the column access enable signal #BE0 at the level L (active) for each cycle synchronously with the ATD signal, when the block selection signal BNK0 is at the level H (active) and the external access execution signal #EX0 is at the level L (active). When the column access enable signal #BE0 is active, bit line pairs specified by the column address A0 through A5 in the first block 20A are selected, and external access is executed to the memory cell specified by the activated word line and the selected bit line pairs.

The external access execution signal #EX0 and the refresh execution signal #RF0 output from the block controller 40A (see FIG. 6) are supplied to the row pre-decoders 30A (see FIG. 4). The column access enable signal #BE0 is supplied to the column decoder 26A (see FIG. 4) in the block 20A.

Figure 9:
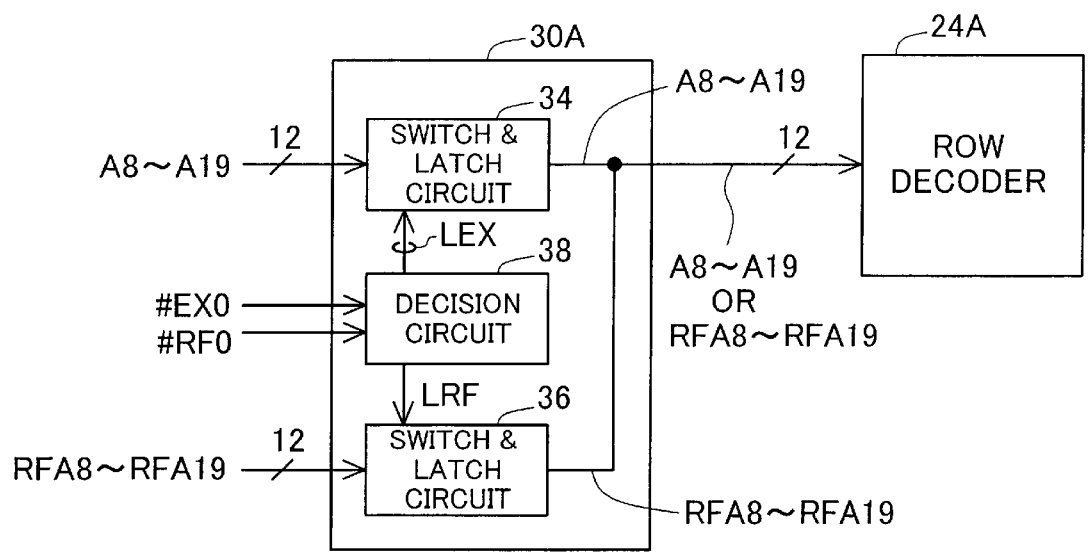
FIG. 9 is a block diagram illustrating the internal structure of the first row pre-decoder 30A shown in FIG. 4.

FIG. 9 is a block diagram illustrating the internal structure of the first row pre-decoder 30A shown in FIG. 4. The row pre-decoder 30A has two switch & latch circuits 34 and 36 and a decision circuit 38. The other row pre-decoders 30B through 30D have the same structure as that of FIG. 8.

The decision circuit 38 receives the external access execution signal #EX0 and the refresh execution signal #RF0 from the block controller 40A. The decision circuit 38 supplies a control signal LEX corresponding to the external access execution signal #EX0 to the first switch & latch circuit 34, while supplying a control signal LRF corresponding to the refresh execution signal #RF0 to the second switch & latch circuit 36.

When the external access execution signal #EX0 is active (at the level L), the first switch & latch circuit 34 latches the row address A8 through A19 supplied from the external device in response to the control signal LEX and transmits the latched row address A8 through A19 to the row decoder 24A in the first block 20A. In this case, the second switch & latch circuit 36 prohibits its output in response to the control signal LRF.

When the refresh execution signal #RF0 is active (at the level L), on the other hand, the second switch & latch circuit 36 latches the refresh address RFA8 through RFA19 supplied from the refresh counter 100 (see FIG. 4) in response to the control signal LRF and transmits the latched refresh address RFA8 through RFA19 to the row decoder 24A. In this case, the first switch & latch circuit 34 prohibits its output in response to the control signal LEX.

The block controller 40A (see FIG. 6) is constructed not to set the two execution signals #EX0 and #RF0 active (at the level L) simultaneously. While both of the two execution signals #EX0 and #RF0 are inactive (at the level H), the row pre-decoder 30A does not supply the address A8 through A19 or RFA8 through RFA19 to the row decoder 24A.

The row pre-decoder 30A selects either one of the row address A8 through A19 and the refresh address RFA8 through RFA19 in response to the signal level of the two execution signals #EX0 and #RF0, and supplies the selected address to the row decoder 24A in the block 20A (see FIG. 4). The row decoder 24A activates one word line in the block 20A specified by the selected address A8 through A19 or RFA8 through RFA19, as receiving the selected address A8 through A19 or RFA8 through RFA19 supplied from the row pre-decoder 30A.

A4. Operations of Access Control Module

Figure 10:
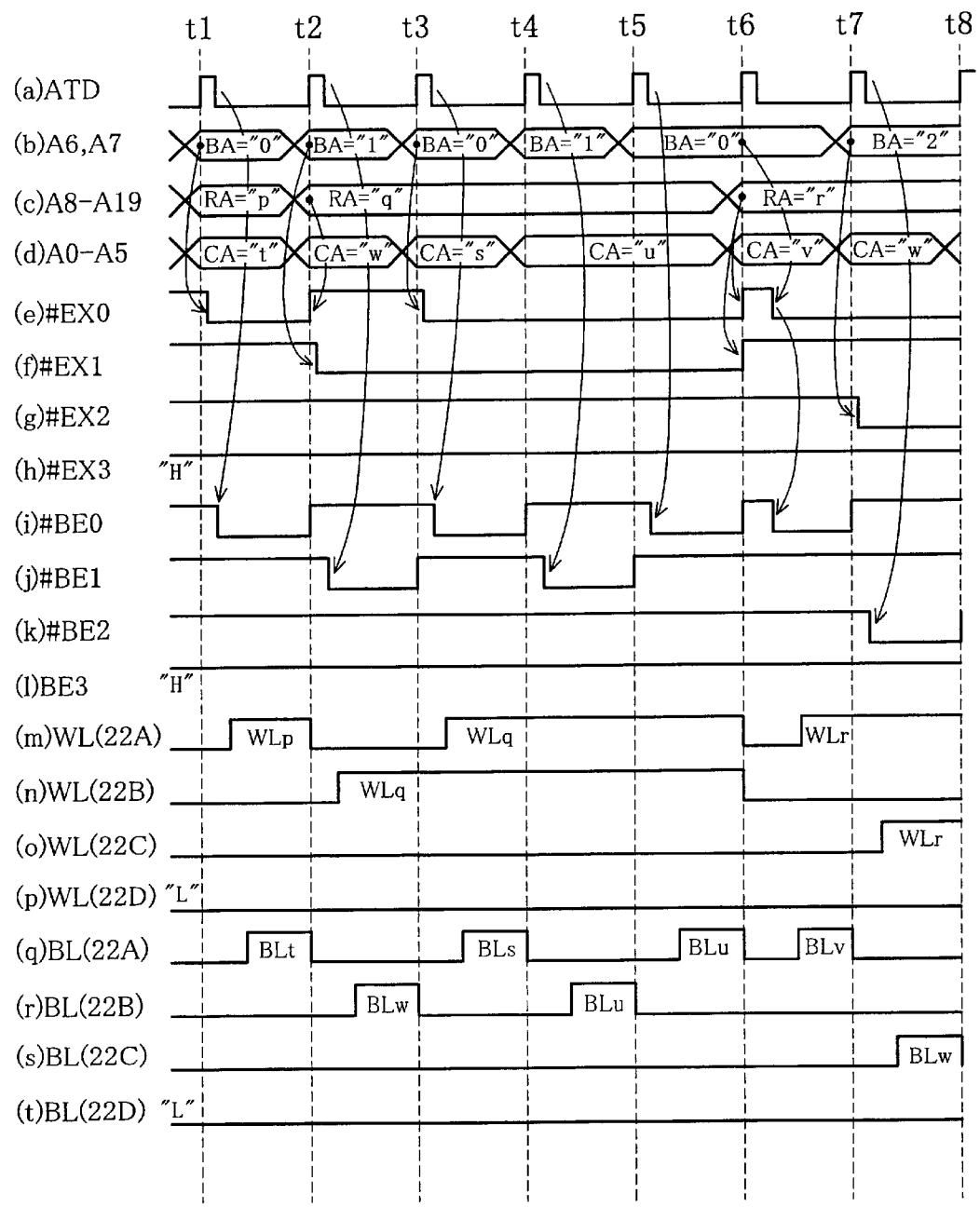
FIG. 10 is a timing chart showing the operations of the respective block controllers 40A through 40D and the states of the word lines and the bit line pairs in operation cycles.

FIG. 10 is a timing chart showing the operations of the respective block controllers 40A through 40D and the states of the word lines and the bit line pairs in the operation cycles. In the operation cycles, the chip select signal #CS is at the level L (active), and the snooze signal ZZ is at the level H. At time points t1 through t7, the ATD signal has rising edges (see FIG. 10(a)). There are seven consecutive operation cycles starting from the respective time points.

The timing chart of FIG. 10 is on the assumption of no refresh requirement in the operation cycles, that is, on the assumption that the refresh timing signal RFTM given to the respective refresh requirement signal generation circuits 50A through 50D has no rising edge. In this case, the refresh requirement signals RFREQ0 through RFREQ3 given to the refresh execution signal generation circuits 44 in the respective block controllers 40A through 40D are set at the level L. Accordingly the refresh execution signals #RF0 through #RF3 output from the refresh execution signal generation circuits 44 in the respective block controllers 40A through 40D are kept at the level H (inactive), whereas the reset signals RST0 through RST3 output from the reset signal generation circuits 46 are kept at the level L.

FIGS. 10(b) through 10(d) respectively show the block address A6 and A7, the row address A8 through A19, and the column address A0 through A5. FIGS. 10(e) through 10(h) show the external access execution signals #EX0 through #EX3 output from the respective block controllers 40A through 40D. FIG. 10(i) through FIG. 10(l) show the column access enable signals #BE0 through #BE3 output from the respective block controllers 40A through 40D.

In the first cycle starting from the time point t1, the value of the block address A6 and A7 (FIG. 108b) is equal to '0', and external access to the first block 20A is required. The first block controller 40A accordingly sets the external access execution signal #EX0 (FIG. 10(e)) at the level L (active), while setting the column access enable signal #BE0 (FIG. 10(i)) at the level L (active) in response to a falling edge of the ATD signal (FIG. 10(i)).

In the second cycle starting from the time point t2, the value of the block address A6 and A7 is changed from '0' to '1' representing the second block 20B. There is no requirement of external access to the first block 20A, but a requirement of external access to the second block 20B. The second block controller 40B accordingly sets the external access execution signal #EX1 (FIG. 10(f)) at the level L (active), while setting the column access enable signal #BE1 (FIG. 10(j)) at the level L (active) in response to a falling edge of the ATD signal.

The value of the row address A8 through A19 (FIG. 10(c)) is changed from 'p' to 'q'. The first block controller 40A accordingly sets the external access execution signal #EX0 at the level H (inactive), while setting the column access enable signal #BE0 at the level H (inactive) in response to a rising edge of the ATD signal at the time point t2.

In the third cycle starting from the time point t3, the value of the block address A6 and A7 is changed again to '0'. There is no requirement of external access to the second block 20B, but a requirement of external access to the first block 20A. In the same manner as the first cycle, the external access execution signal #EX0 is set at the level L (active), while the column access enable signal #BE0 is set at the level L (active).

The value 'q' of the row address A8 through A19 set in the second cycle is kept to the fifth cycle. The second block controller 40B accordingly keeps the external access execution signal #EX1 at the level L (active) in the four consecutive cycles starting from the time point t2. In the third and the fifth cycles, although the external access execution signal #EX1 is kept at the level L (active), there is no requirement of external access to the second block 20B. The column access enable signal #BE0 is thus set at the level H (inactive) in the third and the fifth cycles, when the ATD signal rises at the time points t3 and t5. In the fourth cycle, the value of the block address A0 and A1 is changed to '1', and there is a requirement of external access to the second block 20B. The column access enable signal #BE0 is thus set at the level L (active) in response to a falling edge of the ATD signal.

The value 'q' of the row address A8 through A19 is unchanged to the fifth cycle. The first block controller 40A thus keeps the external access execution signal #EX0 at the level L (active) in the two cycles starting from the time points t4 and t5.

In the fifth cycle, the value of the block address A6 and A7 is changed to '0', and there is a requirement of external access to the first block 20A. Like the first and the third cycles, the column access enable signal #BE0 is set at the level L (active) in response to a falling edge of the ATD signal. Since there is no requirement of external access to the second block 20B, the column access enable signal #BE1 is set at the level H (inactive) in response to a rising edge of the ATD signal.

In the sixth cycle starting from the time point t6, the value of the block address A6 and A7 is kept '0', and there is a requirement of external access to the first block 20A. The value of the row address A8 through A19 is changed from 'q' to 'r'. The external access execution signal #EX0 is set at the level H (inactive) at this moment, like the second cycle. The external access execution signal #EX1 is also set at the level H (inactive). The external access execution signal #EX0 is then set at the level L (active) like the first and the third cycles. This is a requirement of external access to the same first block 20A. As described above, setting the external access execution signal #EX0 at the level L is thus delayed by a time period required for inactivation of the currently active word line, compared with the first and the third cycles.

The column access enable signal #BE0 is set at the level H (inactive) in response to a rising edge of the ATD signal at the time point t6, and is then set at the level L (active) in response to the setting of the external access execution signal #EX0 at the level L (active).

In the seventh cycle starting from the time point t7, the value of the block address A6 and A7 is changed to '2' representing the third block 20C. There is no requirement of external access to the first block 20A, but a requirement of external access to the third block 20C. The third block controller 40C accordingly sets the external access execution signal #EX2 (FIG. 10(g)) at the level L (active), while setting the column access enable signal #BE2 (FIG. 10(k)) at the level L (active) in response to a falling edge of the ATD signal.

Since the value 'r' of the row address A8 through A19 is unchanged, the external access execution signal #EX0 is kept at the level L (active) like the fourth cycle. There is no requirement of external access to the first block 20A, so that the column access enable signal #BE0 is set at the level H (inactive) in response to a rising edge of the ATD signal at the time point t7.

As shown in the second through the sixth cycles of FIG. 10, each of the block controllers 40A through 40D can set another external access execution signal at the level L (active) under the condition that one external access execution signal has been set at the level L (active). The setting of each external access execution signal at the level L (active) is kept until a change of the row address A8 through A19 among the address A0 through A19 used in the subsequent cycles.

If there is a requirement of external access to the third block 20C in the fourth cycle of FIG. 10, the third external access execution signal #EX3 is also set at the level L (active) and is kept at the level L (active) until a change of the row address A8 through A19. In response to the requirement of external access to the third block 20C, the third column access enable signal #BE3 is also set at the level L (active).

FIGS. 10(m) through 10(p) show the state of word lines WL in the sub-arrays 22A through 22D of the respective blocks 20A through 20D (FIG. 4). Although multiple word lines are included in each sub-array, two or any greater number of word lines can not be activated simultaneously in one sub-array. For example, different word lines successively activated in the sub-array 22A are shown in the same timing chart of FIG. 10(m). WLp, WLq, and WLr risen to the level H respectively show different word lines activated.

FIGS. 10(q) through 10(t) show the state of bit line pairs BL in the sub-arrays 22A through 22D of the respective blocks 20A through 20D. The number of bit line pairs corresponding to the number of output bits, that is, 16 bit line pairs, are simultaneously selected in one sub-array. For example, different bit line pairs successively selected in the sub-array 22A are shown in the same timing chart of FIG. 10(q). BLt, BLs, BLu, and BLv risen to the level H respectively show different bit line pairs selected.

Figure 11:
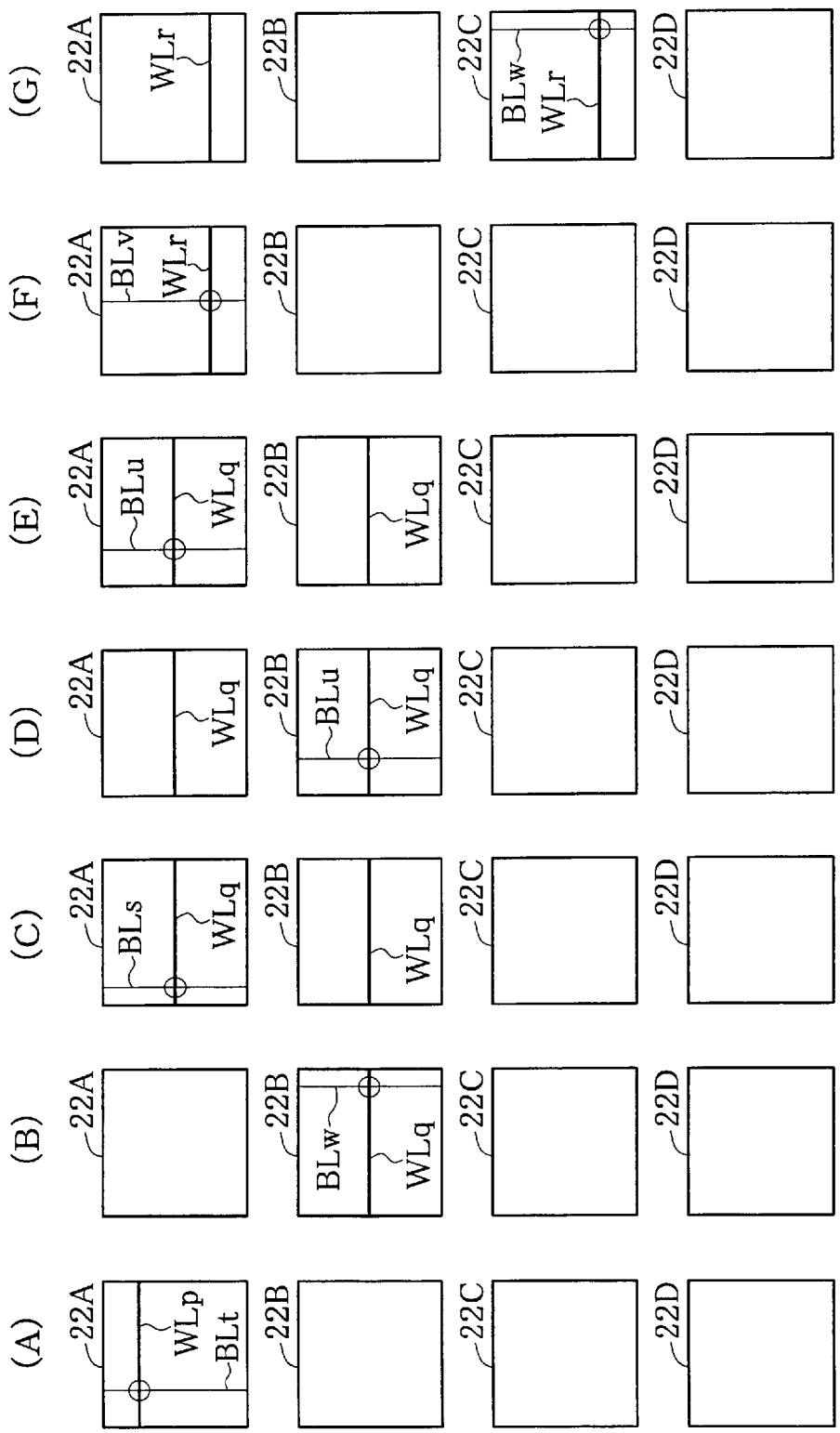
FIG. 11 schematically illustrates the activated word lines and the selected bit line pairs in the respective sub-arrays 22A through 22D in the operation cycles of FIG. 10.

FIG. 11 schematically illustrates the activated word lines and the selected bit line pairs in the respective sub-arrays 22A through 22D in the operation cycles of FIG. 10. FIGS. 11(A) through 11(G) respectively show the inside of the sub-arrays 22A through 22D in the first through the seventh operation cycles starting from the time points t1 through t7 in FIG. 10. The activated word lines in the sub-arrays 22A through 22D are expressed by horizontal lines, whereas the bit line pairs are expressed by vertical lines in the sub-arrays 22A through 22D. In the sub-array with both the activated word line and the selected bit line pairs, external access is executed to a memory cell of 1 word (16 bits) (part expressed by an open circle) specified by the word line and the bit line pairs.

In the first cycle, as shown in FIGS. 10(e) through 10(h), only the first external access execution signal #EX0 is set at the level L (active). Only a 'p-th' word line WLp specified by the row address A8 through A19 (FIG. 10(c)) is accordingly activated in the first sub-array 22A in the first cycle, while no word line is activated in the other sub-arrays 22B through 22D, as shown in FIGS. 10(m) through 10(p) and FIG. 11(A). As shown in FIGS. 10(i) through 10(l), only the first column access enable signal #BE0 is set at the level L (active). Only 't-th' bit line pairs BLt specified by the column address A0 through A5 (FIG. 10(d)) are accordingly selected in the first sub-array 22A, while no bit line pairs are selected in the other sub-arrays 22B through 22D, as shown in FIGS. 10(q) through 10(t) and FIG. 11(B). There is a requirement of external access to the first block 20A (FIG. 10(e)) in the first cycle, so that external access is executed to the memory cell in the first sub-array 22A (FIG. 11(A)).

In the second cycle, only the second external access execution signal #EX1 is set at the level L (active). The 'p-th' word line WLp is accordingly inactivated in the first sub-array 22A, while only a 'q-th' word line WLq is activated in the second sub-array 22B in the second cycle, as shown in FIGS. 10(m) through 10(p) and FIG. 11(B). As shown in FIGS. 10(i) through 10(1), only the second column access enable signal #BE1 is set at the level L (active). The 't-th' bit line pairs BLt accordingly fall into the non-selected state in the first sub-array 22A, while only 'w-th' bit line pairs BLw are selected in the second sub-array 22B, as shown in FIGS. 10(q) through 10(t) and FIG. 11(B). There is a requirement of external access to the second block 20B in the second cycle, so that external access is executed to the memory cell in the second sub-array 22B (FIG. 11(B)).

In the third cycle, while the second external access execution signal #EX1 is kept at the level L (active), the first external access execution signal #EX0 is set at the level L (active). The 'q-th' word line WLq is accordingly activated in the first sub-array 22A in the third cycle, while the 'q-th' word line WLq is kept active in the second sub-array 22B, as shown in FIGS. 10(m) through 10(p) and FIG. 11(C). As shown in FIGS. 10(i) through 10(1), only the first column access enable signal #BE0 is set at the level L (active). The 'w-th' bit line pairs BLw accordingly fall into the non-selected state in the second sub-array 22B, while only 's-th' bit line pairs BLs are selected in the first sub-array 22A, as shown in FIGS. 10(q) through 10(t) and FIG. 11(C). There is a requirement of external access to the first block 20A in the third cycle. External access is thus executed to the memory cell in the first sub-array 22A, whereas no external access is executed to the memory cell in the second sub-array 22B (FIG. 11(C)).

In the fourth and the fifth cycles, the two external access execution signals #EX0 and #EX1 are kept at the level L (active). The 'q-th' word line WLq is accordingly kept active in the two sub-arrays 22A and 22B in the fourth and the fifth cycles, as shown in FIGS. 10(m) through 10(p), FIG. 12(D), and FIG. 12(E). In the fourth cycle, only the second column access enable signal #BE1 is set at the level L (active), as shown in FIGS. 10(i) through 10(1). The 's-th' bit line pairs BLs accordingly fall into the non-selected state in the first sub-array 22A, while only 'u-th' bit line pairs BLu are selected in the second sub-array 22B, as shown in FIGS. 10(q) through 10(t) and FIG. 11(D). In the fifth cycle, only the first column access enable signal #BE0 is set at the level L (active), as shown in FIGS. 10(i) through 10(1). The 'u-th' bit line pairs BLu accordingly fall into the non-selected state in the second sub-array 22B, while only 'v-th' bit line pairs BLv are selected in the first sub-array 22A, as shown in FIGS. 10(q) through 10(t) and FIG. 11(E). External access is thus executed only to the memory cell in the second sub-array 22B in the fourth cycle (FIG. 11(D)), whereas external access is executed only to the memory cell in the first sub-array 22A in the fifth cycle (FIG. 11(E)).

In the sixth cycle, only the first external access execution signal #EX0 is set at the level L (active). The 'q-th' word line WLq is accordingly inactivated in the two sub-arrays 22A and 22B, while only an 'r-th' word line WLr is activated in the first sub-array 22A, as shown in FIGS. 10(m) through 10(p) and FIG. 12(F). As shown in FIGS. 10(i) through 10(1), only the first column access enable signal #BE0 is set at the level L (active) in the sixth cycle. The 'u-th' bit line pairs BLu accordingly fall into the non-selected state in the first sub-array 22A, while only the 'v-th' bit line pairs BLv are selected in the first sub-array 22A, as shown in FIGS. 10(q) through 10(t) and FIG. 11(F). External access is thus executed to the memory cell in the first sub-array 22A in the sixth cycle (FIG. 11(F)).

In the seventh cycle, the third external access execution signal #EX2, as well as the first external access execution signal #EX0 is set at the level L (active), like the fourth cycle. The r-th' word line WLr is accordingly activated in the third sub-array 22C in the seventh cycle, while the 'r-th' word line WLr is kept active in the first sub-array 22A as shown in FIGS. 11(m) through 11(p) and FIG. 11(G). As shown in FIGS. 10(i) through 10(l), only the third column access enable signal #BE2 is set at the level L (active) in the seventh cycle. The 'v-th' bit line pairs BLv accordingly fall into the non-selected state in the first sub-array 22A, while only 'w-th' bit line pairs BLw are selected in the second sub-array 22B, as shown in FIGS. 10(q) through 10(t) and FIG. 11(G). External access is thus executed to only the memory cell in the third sub-array 22C in the seventh cycle (FIG. 11(G)).

As explained in FIGS. 10 and 11, in response to a requirement of external access to a certain block, each of the block controllers 40A through 40D activates the external access execution signal and the column access enable signal corresponding to the certain block. At this moment, the word line specified by the row address in the block is activated, and the bit line pairs specified by the column address are selected. External access is then executed to the memory cell specified by the activated word line and the selected bit line pairs. Each of the block controllers 40A through 40D keeps the active state (level L) of the external access execution signal until a change of the row address A8 through A19 among the address A0 through A19 used in a subsequent cycle. In this state, the word line is kept active, and external access to the memory cell on the active word line is executed in the cycle where external access to the same block is required again. This arrangement does not require iterative activation and inactivation of the word line for every cycle, thus desirably reducing power consumption and enabling high-speed access, such as page mode access.

In response to a rise of the refresh timing signal RFTM output from the RF timer 70 (see FIG. 4) to the level H, the refresh requirement signals RFREQ0 through RFREQ3 output from the RFREQ generation circuits 50A through 50D are set at the level H. The refreshing operation is then required to the respective blocks 20A through 20D.

With regard to one block subjected to external access, the refresh execution signal is set active after completion of the external access to the block. At this moment, the currently active word line in the block is inactivated. Another word line specified by the refresh address is then activated, and the refreshing operation is performed in all the memory cells on the newly activated word line.

In the stand-by cycle and the snooze state, no external access is executed, but only the refreshing operation is performed.

In the stand-by cycle and the snooze state, no external access is required to any of the blocks 20A through 20D, so that the refreshing operation is performed simultaneously in the four blocks 20A through 20D.

A5. Construction of Input-Output Data Buffer

Figure 12:
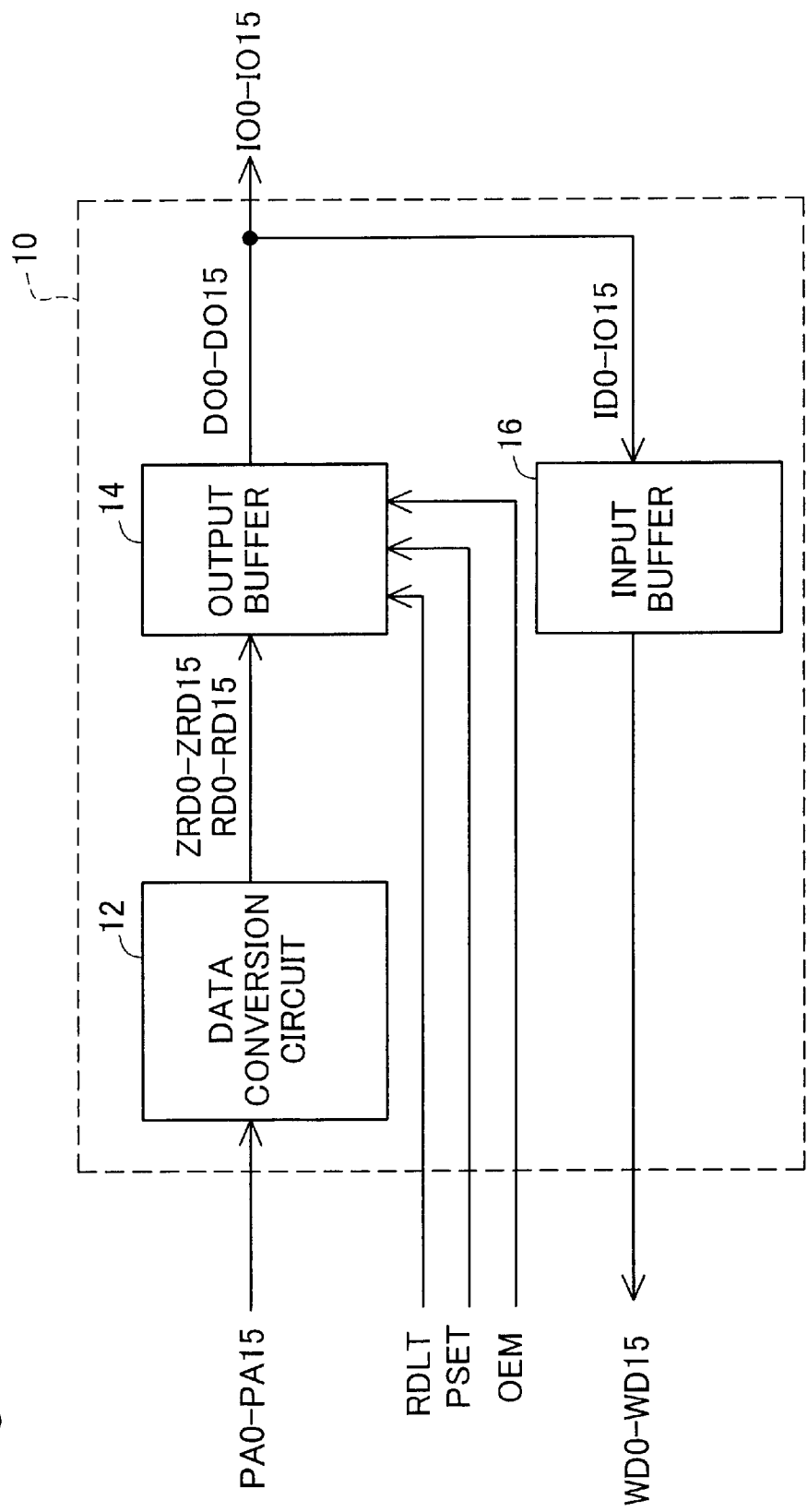
FIG. 12 is a block diagram illustrating the internal structure of the data input-output buffer 10 shown in FIG. 4.

FIG. 12 is a block diagram illustrating the internal structure of the data input-output buffer 10 shown in FIG. 4. The data input-output buffer 10 includes a data conversion circuit 12, an output buffer 14, and an input buffer 16.

The input buffer 16 outputs input data signals ID0 through ID15 from the input-output data terminals IO0 through IO15 as writing data signals WD0 through WD15.

The data conversion circuit 12 converts reading signals PA0 through PA15 output from non-illustrated preamplifiers included in the respective blocks of the memory cell array 20 into positive data signals RD0 through RD15 and negative data signals ZRD0 through ZRD15, which are to be supplied to the output buffer 14. The positive data signals RD0 through RD15 are kept at the level H when the reading signals PA0 through PA15 represent a value '1', while being changed to the level L when the reading signals PA0 through PA15 represent a value '0'. The negative data signals ZRD0 through ZRD15 are, on the other hand, kept at the level H when the reading signals PA0 through PA15 represent the value '0', while being changed to the level L when the reading signals PA0 through PA15 represent the value '1'.

The output buffer 14 transmits output data signals DO0 through DO15 to the input-output data terminals IO0 through IO15, based on a latch signal RDLT, a preset signal PSET, an output execution signal OEM, and the positive data signals RD0 through RD15 and the negative data signals ZRD0 through ZRD15 supplied from the data conversion circuit 12. The details of the output buffer 14 will be discussed later.

A6. Construction and Operations of Output Control Circuit

Figure 13:
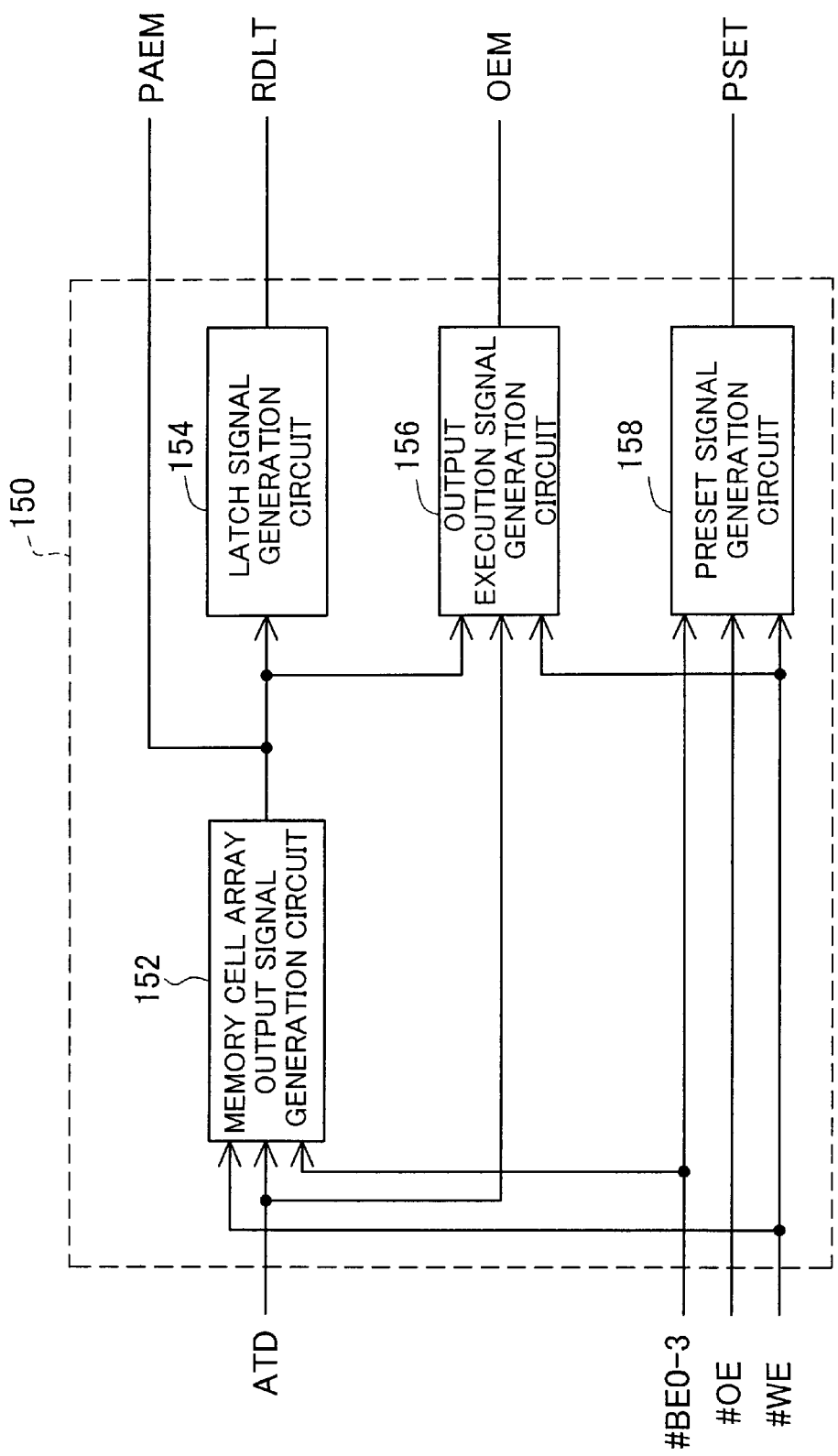
FIG. 13 is a block diagram illustrating the internal structure of the output control circuit 150 shown in FIG. 4.

FIG. 13 is a block diagram illustrating the internal structure of the output control circuit 150 shown in FIG. 4. The output control circuit 150 includes a memory cell array output signal generation circuit 152, a latch signal generation circuit 154, an output execution signal generation circuit 156, and a preset signal generation circuit 158.

The memory cell array output signal generation circuit 152 generates a preamplifier enable signal PAEM, based on the column access enable signals #BE0 through #BE3, the ATD signal, and the write enable signal #WE. The preamplifier enable signal PAEM is a pulse signal set by taking into account a delay time between a start of the operation cycle and output of the information stored in a selected memory cell in the memory cell array 20 to the preamplifier.

The latch signal generation circuit 154 outputs the latch signal RDLT. The latch signal RDLT is a pulse signal used for latch of the positive data signals RD0 through RD15 and the negative data signals ZRD0 through ZRD15 output from the data conversion circuit 12 shown in FIG. 12. The latch signal RDLT is typically generated by delaying the preamplifier enable signal PAEM.

The output execution signal generation circuit 156 generates the output execution signal OEM, based on the preamplifier enable signal PAEM, the ATD signal, and the write enable signal #WE.

The preset signal generation circuit 158 generates the preset signal PSET, based on the write enable signal #WE, the output enable signal #OE, and the column access enable signals #BE0 through #BE3.

Figure 14:
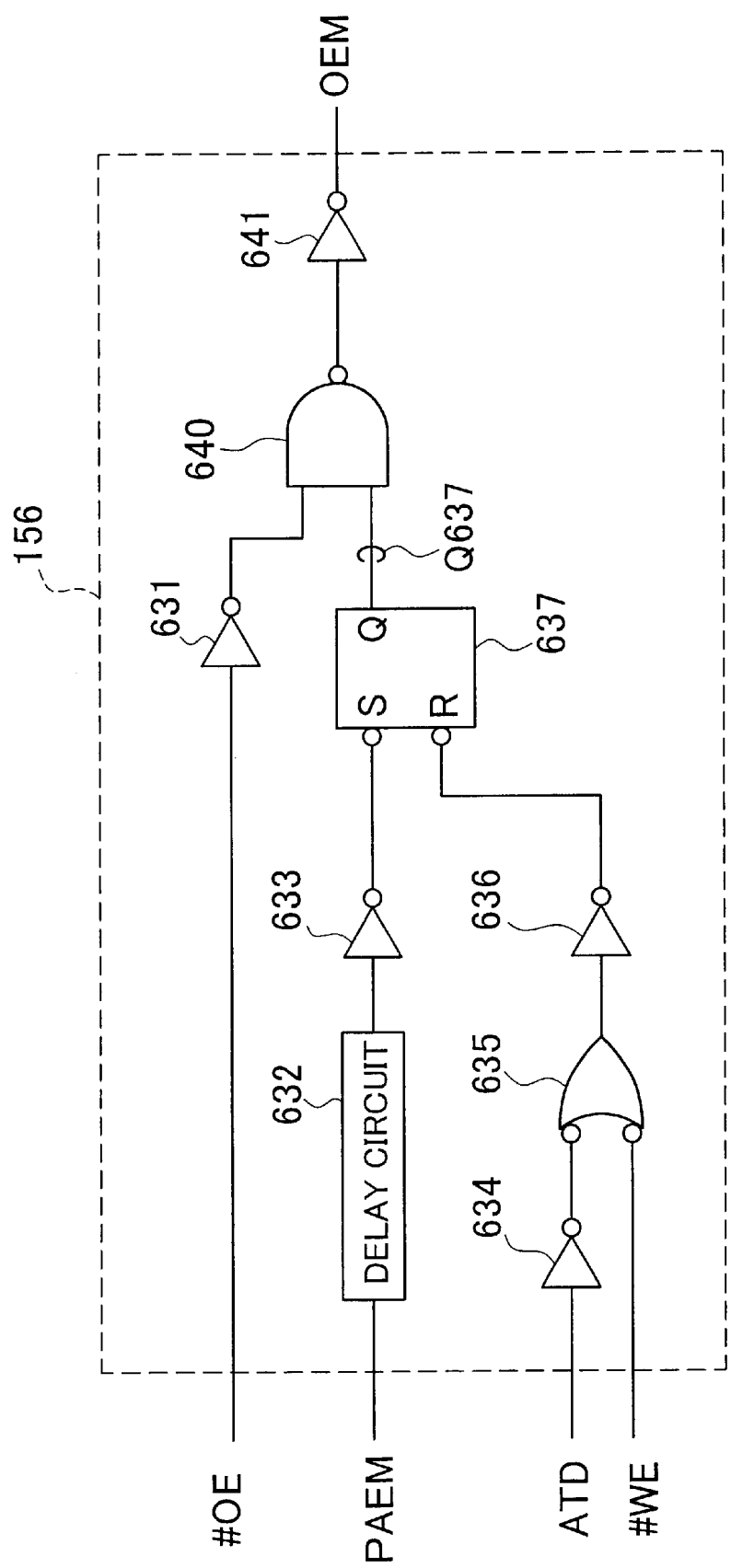
FIG. 14 is a block diagram illustrating the internal structure of the output execution signal generation circuit 156 of FIG. 13.

FIG. 14 is a block diagram illustrating the internal structure of the output execution signal generation circuit 156 of FIG. 13. The output execution signal generation circuit 156 includes a NAND gate 640 and an inverter 641 that inverts the output of the NAND gate 640 and generates the output execution signal OEM. The NAND gate 640 receives the output enable signal #OE inverted by an inverter 631 and an output Q637 of an RS latch 637. A set terminal S of the RS latch 637 receives the pre-amplifier enable signal PAEM delayed by a delay circuit 632 and inverted by an inverter 633. A reset terminal R of the RS latch 637 receives an output of a negative-input OR gate 635 inverted by an inverter 636. Inputs of the negative-input OR gate 635 are the ATD signal inverted by an inverter 634 and the write enable signal #WE. The output execution signal generation circuit 156 determines whether or not the data output from the memory cell array 20 is transmittable. The affirmative decision is given when the output enable signal #OE is at the level L (active) and a delay time set in the delay circuit 632 has elapsed since a change of the pre-amplifier enable signal PAEM to the level H. The RS latch Q637 is then set, and the output execution signal OEM rises to the level H (active). The RS latch 637 is reset at the timing of a rising edge of the ATD signal, and the output execution signal OEM falls to the level L (inactive).

Figure 15:
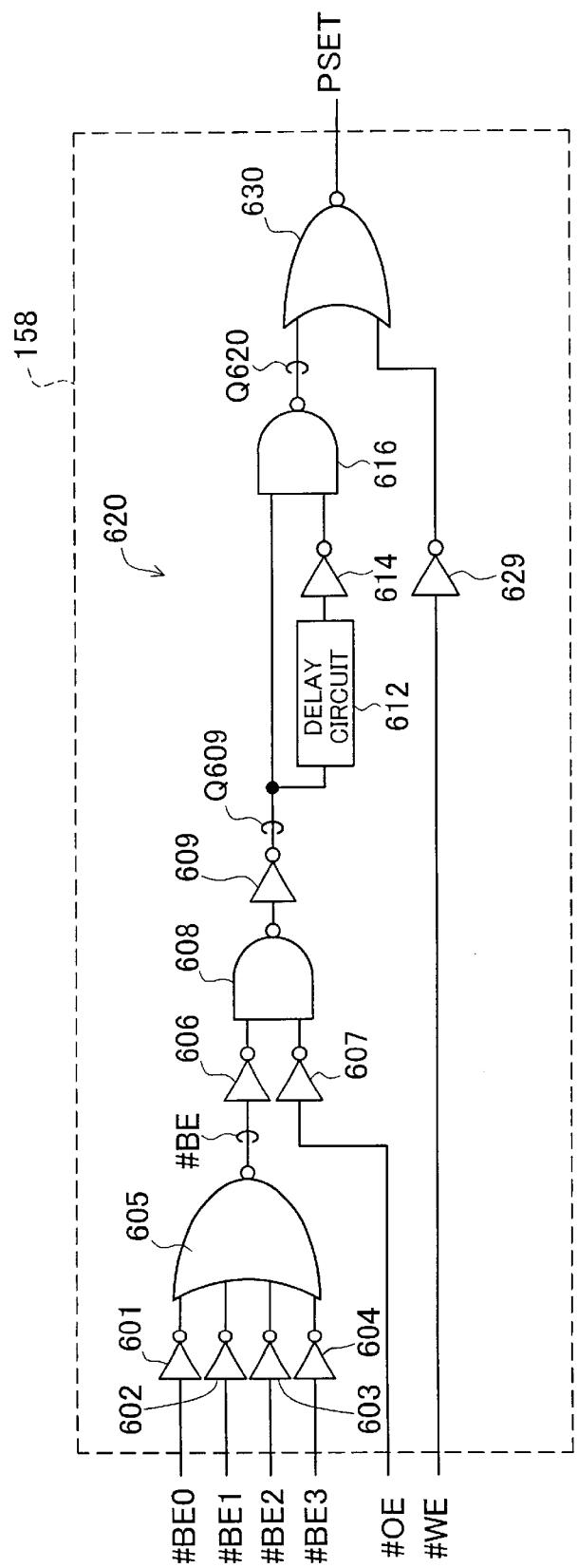
FIG. 15 is a block diagram illustrating the internal structure of the preset signal generation circuit 158 of FIG. 13.

FIG. 15 is a block diagram illustrating the internal structure of the preset signal generation circuit 158 of FIG. 13. The preset signal generation circuit 158 has a NOR gate 630 that outputs the preset signal PSET. The NOR gate 630 receives an output Q620 of a pulse generation circuit 620 and the write enable signal #WE inverted by an inverter 629.

The pulse generation circuit 620 receives an output Q609 obtained by inverting the output of a NAND gate 608 by an inverter 609.

The pulse generation circuit 620 has a delay circuit 612, an inverter 614, and a NAND gate 616. The NAND gate 616 receives the output Q609 of the inverter 609 and the output Q609 delayed by the delay circuit 612 and inverted by the inverter 614.

Inputs of the NAND gate 608 are the inversion of a column access signal #BE, output from a 4-input NOR gate 605, by an inverter 606, and the inversion of the output enable signal #OE by an inverter 607.

The 4-input NOR gate 605 receives the respective inversions of the column access enable signals #BE0 through #BE3 of the multiple blocks by inverters 601 through 604. The column access signal #BE is set at the level L (active) when any of the column access enable signals #BE0 through #BE3 is at the level L (active).

The preset signal generation circuit 158 keeps the preset signal PSET at the level H (active) for a time period corresponding to a delay time set in the delay circuit 612 in a read operation cycle, that is, with a fall of any of the column access enable signals #BE0 through #BE3 to the level L (active) while the write enable signal #WE is at the level H.

Figure 16:
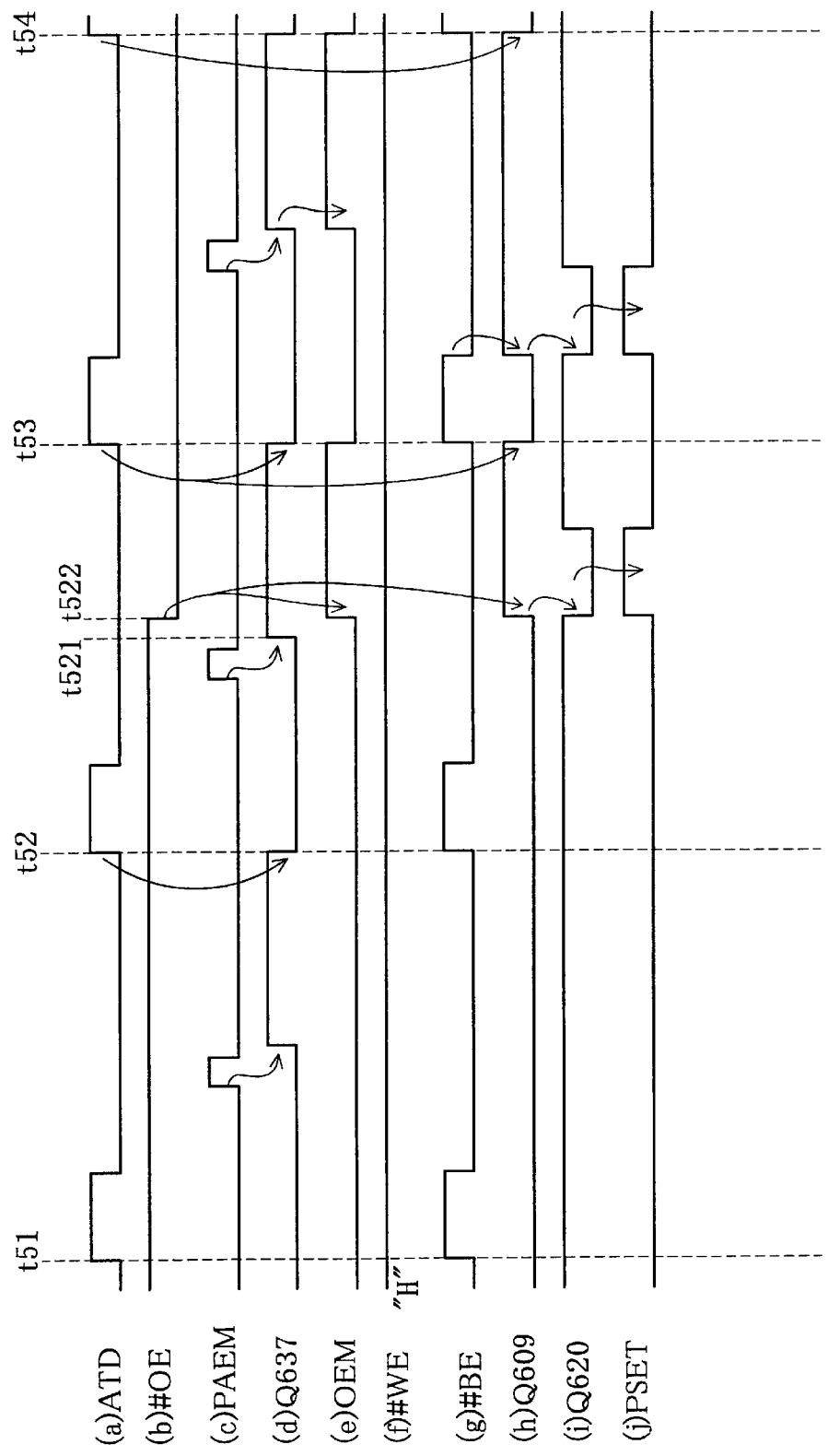
FIG. 16 is a timing chart showing the operations of the output execution signal generation circuit 156 and the preset signal generation circuit 158.

FIG. 16 is a timing chart showing the operations of the output execution signal generation circuit 156 and the preset signal generation circuit 158. The ATD signal has rising edges at time points t51, t52, and t53 (FIG. 16(a)). The write enable signal #WE is set at the level H (FIG. 16(f)). The cycle starting from each of the time points t51, t52, and t53 represents a read operation cycle.

The pre-amplifier enable signal PAEM (FIG. 16(c)) is a pulse signal that rises to the level H after elapse of a fixed time from each of the time points t51, t52, and t53 as mentioned above. The RS latch 637 (FIG. 14) is set after elapse of the delay time in the delay circuit 632 from a rising edge of the pure-amplifier enable signal PAEM, and is reset at the timing of a next rising edge of the ATD signal. The output execution signal OEM is varied according to the signal level of the output Q637 of the RS latch 637 when the output enable signal #OE is at the level L, while being fixed to the level L when the output enable signal #OE is at the level H. As in the cycle starting from the time point t51, when the output enable signal #OE (FIG. 16(b)) is at the level H, the output execution signal OEM (FIG. 16(e)) is kept at the level L. As in the cycle starting from the time point t53, when the output enable signal #OE is at the level H, the output execution signal OEM is varied according to the output Q637 (FIG. 16(d)). As in the cycle starting from the time point t52, when the output enable signal #OE is changed to the level L at a time t522, which is later than a time t521 when the output Q637 is set at the level H, the output execution signal OEM is fixed to the level L until the output enable signal #OE is changed to the level L at the time t522. When the output enable signal #OE is changed to the level L prior to the time t521 when the output Q637 is set at the level H, the output execution signal OEM is varied according to the output Q637 (FIG. 16(d)) in the same manner as the cycle starting from the time point t53.

One of the column access enable signals #BE0 through #BE3 falls to the level L (active) in each cycle of read operation as shown in FIGS. 10(i) through 10(l). The column access signal #BE (FIG. 16(g)) is accordingly changed to the level L (active) in each cycle.

The output of the NAND gate 608 (FIG. 15) is fixed to the level H when the output enable signal #OE is at the level H, while being varied according to the column access signal #BE when the output enable signal #OE is at the level L. In the cycle starting from the time point t51, the output Q609 (FIG. 16(h)) of the inverter 609 is kept at the level L, since the output enable signal #OE is at the level H (inactive). In the cycle starting from the time point t52, the output Q609 rises to the level H with a fall of the output enable signal #OE to the level L (active) at the time t522, and again falls to the level L at the starting time t53 of the subsequent cycle. In the cycle starting from the time point t53, the output Q609 rises to the level H with a fall of the column access signal #BE to the level L, and again falls to the level L at a starting time t54 of a subsequent cycle. The output Q620 (FIG. 16(i)) of the pulse generation circuit 610 is a pulse signal that is kept at the level L for a time period corresponding to the delay time set in the delay circuit 611 after a rise of the output Q609 to the level H. The preset signal PSET (FIG. 16(k)) has a pulse that rises to the level H with a variation in output Q620, while the write enable signal #WE is at the level H. The preset signal PSET has no pulse in write operation cycles where the write enable signal #WE is at the level L.

The timing of changing the output execution signal OEM to the level H is readily adjustable by regulating the delay time set in the delay circuit 632 (FIG. 14). The pulse width of the preset signal PSET is readily changeable by regulating the delay time set in the delay circuit 611 (FIG. 15).

Figure 17:
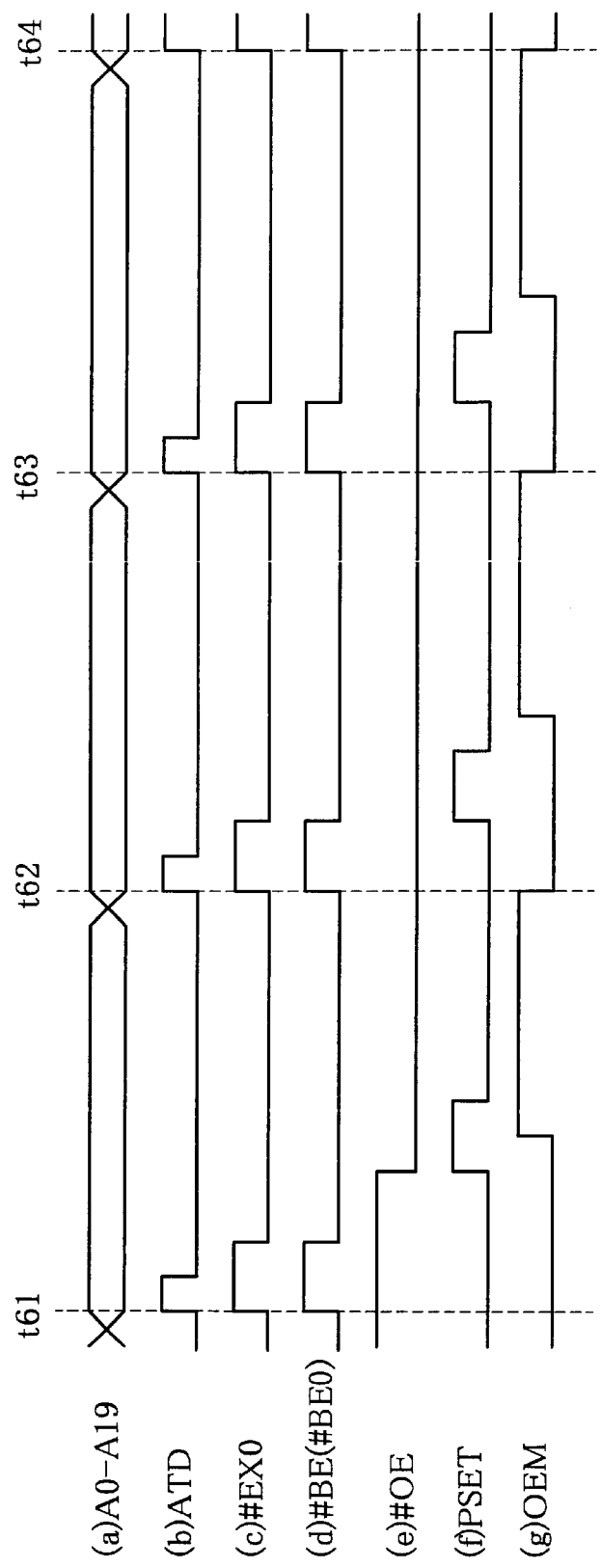
FIG. 17 is a timing chart of an output execution signal OEM and a preset signal PSET in the case of read operation by random access.

FIG. 17 is a timing chart of the output execution signal OEM and the preset signal PSET in the case of read operation by random access. The ATD signal has rising edges at time points t61, t62, and t63 (FIG. 17(b)) according to the variation in address A0 through A20 (FIG. 17(a)). In each cycle, the external access execution signal #EX0 (FIG. 17(c)) changes from the level H (inactive) to the level L (active). The corresponding column access enable signal #BE0 and the column access signal #BE (FIG. 17(d)) accordingly fall to the level L (active).

In the cycle starting from the time point t61, the output enable signal #OE (FIG. 17(e)) changes to the level L (active) after a fall of the column access signal #BE to the level L (active). The preset signal PSET (FIG. 17(f)) is kept at the level H for a fixed time period after a fall of the output enable signal #OE to the level L, as shown in FIG. 16(f).

In the subsequent cycles starting from the respective time points t62 and t63, the output enable signal #OE is kept at the level L (active). The preset signal PSET is kept at the level H (active) for a fixed time period after a fall of the column access signal #BE to the level L (active).

The output execution signal OEM (FIG. 17(g)) is generated according to the relationship between the output Q637 of the RS latch 637 (FIG. 14) and the output enable signal #OE, which is specified by the pre-amplifier enable signal PAEM as shown in FIG. 16(e).

Figure 18:
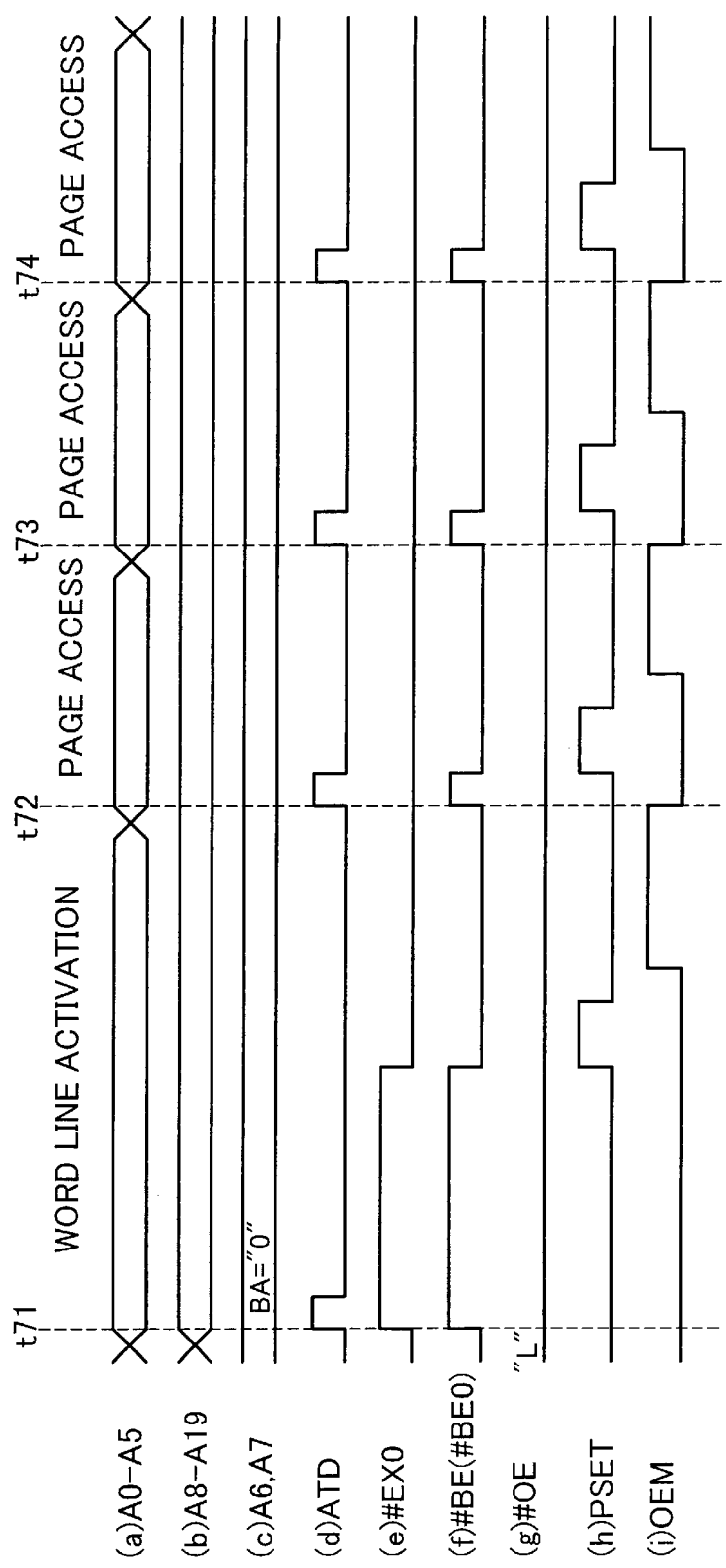
FIG. 18 is a timing chart of the output execution signal OEM and the preset signal PSET in the case of read operation by page mode access.

FIG. 18 is a timing chart of the output execution signal OEM and the preset signal PSET in the case of read operation by page mode access. The ATD signal has rising edges at time points t71, t72, and t73 in respective operation cycles (FIG. 18(d)) according to the variation in address A0 through A20 (FIGS. 18(a) through 18(c)). The output enable signal #OE is kept at the level L (active) (FIG. 18(g)).

In the case of page mode access, the block address A6 and A7 (FIG. 18(c)) and the row address A8 through A19 (FIG. 18(b)) are fixed and unchanged, while only the column address A0 through A5 (FIG. 18(a)) is varied in the respective cycles. Only the external access execution signal of the block specified by the block address A6 and A7 is accordingly set at the level L (active), among the external access execution signals #EX0 through #EX3 of the respective blocks. In the illustrated example, the external access execution signal #EX0 (FIG. 18(e)) is set at the level L (active). Since the row address A8 through A19 is unchanged, the external access execution signal #EX0 changes from the level H (inactive) to the level L (active) only in the first cycle starting from the time point t71 (word line activation cycle). The external access execution signal #EX0 is kept at the level L (active) in the subsequent cycles (page access cycles).

The column access enable signal #BE0 of the selected block changes from the level H (inactive) to the level L (active) in each cycle where the external access execution signal #EX0 is kept at the level L (active). The column access signal #BE (FIG. 18(f)) accordingly falls to the level L (active). As in the case of random access, the preset signal PSET (FIG. 18(h)) is kept at the level H (active) for a fixed time period after a fall of the column access signal #BE to the level L (active).

The output execution signal OEM (FIG. 18(i)) is generated according to the relationship between the output Q637 of the RS latch 637 (FIG. 14) and the output enable signal #OE specified by the pre-amplifier enable signal PAEM, as shown in FIG. 16(e).

A7. Construction and Operations of Output Circuit

Figure 19:
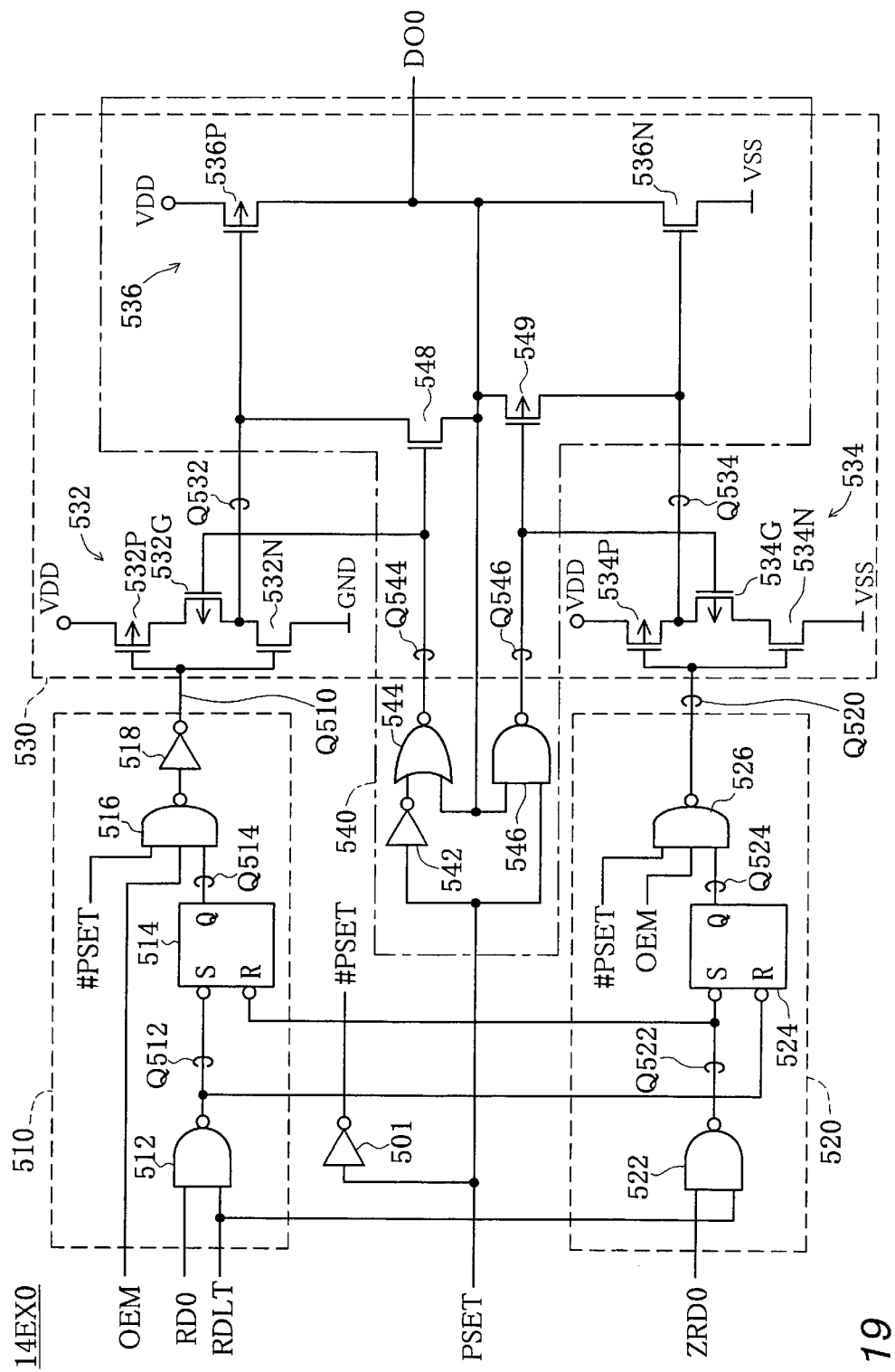
FIG. 19 is a circuit diagram illustrating the internal structure of a fist output circuit 14EX0.

FIG. 19 is a circuit diagram illustrating the internal structure of a fist output circuit 14EX0, among sixteen output circuits 14EX0 through 14EX15 included in the output buffer 14 of FIG. 12. The other output circuits 14EX1 through 14EX15 have the same structure as that of FIG. 19.

The output circuit 14EX0 has a positive data latch circuit 510 that latches the positive data signal RD0 in response to the latch signal RDLT, a negative data latch circuit 520 that latches the negative data signal ZRD0 in response to the latch signal RDLT, an output drive circuit 530 that generates the output data signal DO0 based on an output Q510 of the positive data latch circuit 510 and an output Q520 of the negative data latch circuit 520, and a preset circuit 540 that presets the signal level (output level) of the output data signal DO0.

The positive data latch circuit 510 has a NAND gate 512, an RS latch 514, a 3-input NAND gate 516, and an inverter 518. The NAND gate 512 receives the positive data signal RD0 and the latch signal RDLT. The output of the NAND gate 512 is input into a set terminal S of the RS latch 514. The output of a NAND gate 522 included in the negative data latch circuit 520 is input into a reset terminal R of the RS latch 514. The NAND gate 522 receives the negative data signal ZRD0 and the latch signal RDLT.

Inputs of the 3-input NAND gate 516 are the output of the RS latch 514, the output execution signal OEM, and an inverted preset signal #PSET obtained by inverting the preset signal PSET by an inverter 501. The output of the 3-input NAND gate 516 is inverted by the inverter 518 and is transmitted as an output Q510.

The negative data latch circuit 520 has the NAND gate 522, an RS latch 524, and a 3-input NAND gate 526. The NAND gate 522 receives the negative data signal ZRD0 and the latch signal RDLT. The output of the NAND gate 522 is input into the reset terminal R of the RS latch 514, as well as into a set terminal S of the RS latch 524. The output of the NAND gate 512 included in the positive data latch circuit 510 is input into a reset terminal R of the RS latch 524.

Inputs of the 3-input NAND gate 526 are the output of the RS latch 524, the output execution signal OEM, and the inverted preset signal #PSET obtained by inverting the preset signal PSET by the inverter 501. The output of the 3-input NAND gate 526 is transmitted as an output Q520 of the negative data latch circuit 520.

The positive data latch circuit 510 and the negative data latch circuit 520 set their outputs Q510 and Q520 according to the value of the reading data specified by the positive data signal RD0 and the negative data signal ZRD0, when the output execution signal OEM and the preset signal PSET are at the level H (active). In the case where the positive data signal RD0 latched by the RS latch 514 is at the level H and the negative data signal ZRD0 latched by the RS latch 524 is at the level L, the value of the reading data is equal to '1' and the outputs Q510 and Q520 are set at the level H. In the case where the positive data signal RD0 latched by the RS latch 514 is at the level L and the negative data signal ZRD0 latched by the RS latch 524 is at the level H, the value of the reading data is equal to '0' and the outputs Q510 and Q520 are set at the level L.

When either of the output execution signal OEM and the preset signal PSET is at the level L (inactive), the output Q510 of the positive data latch circuit 510 is set at the level L, and the output Q520 of the negative data latch circuit 520 is set at the level H.

Figure 20:
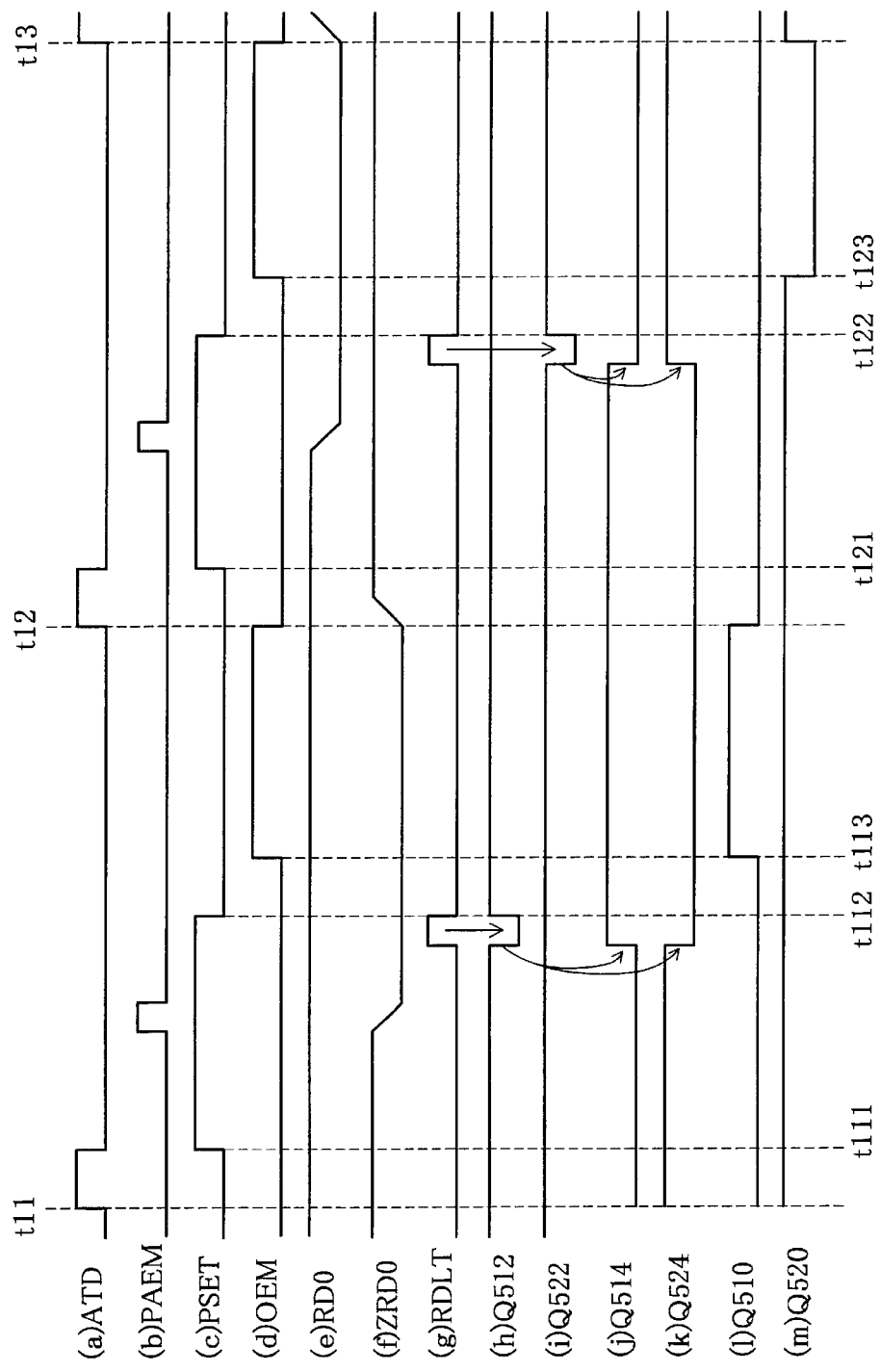
FIG. 20 is a timing chart showing the operations of a positive data latch circuit 510 and a negative data latch circuit 520.

FIG. 20 is a timing chart showing the operations of the positive data latch circuit 510 and the negative data latch circuit 520. The ATD signal has rising edges at time points t11, t12, and t13 (FIG. 20(a)), which represent start timings of read operation cycles. The preset signal PSET (FIG. 20(c)) and the output execution signal OEM (FIG. 20(d)) vary in the same manner as FIG. 16(j) and FIG. 16(e).

The positive data signal RD0 (FIG. 20(e)) and the negative data signal ZRD0 (FIG. 20(f)) are set at the signal levels corresponding to the reading data read out of the memory cell array, when the pre-amplifier enable signal PAEM (FIG. 20(b)) has a pulse. In the cycle starting from the time point t111, the negative data signal ZRD0 falls to the level L while the positive data signal RD0 is kept at the level H. Namely the value of the reading data is equal to '1'. In the cycle starting from the time point t12, the positive data signal RD0 falls to the level L while the negative data signal ZRD0 is kept at the level H. Namely the value of the reading data is equal to '0'. The positive data signal RD0 and the negative data signal ZRD0 are reset to the level H at the start timing of a subsequent cycle.

The latch signal RDLT (FIG. 20(g)) is a pulse signal rising at specific timings to enable latch of the output positive data signal RD0 and negative data signal ZRD0.

In the cycle starting from the time point t111, the negative data signal ZRD0 falls to the level L, while the positive data signal RD0 is kept at the level H. The output Q512 (FIG. 20(h)) of the NAND gate 512 (FIG. 19) included in the positive data latch circuit 510 is a pulse signal that falls synchronously with the latch signal RDLT. The output Q522 of the NAND gate 522 included in the negative data latch circuit 520, on the other hand, has no pulse but is kept at the level H. The output Q514 (FIG. 20(j)) of the RS latch 514 included in the positive data latch circuit 510 is set at the level H by the pulse signal of the output Q512. The output Q524 (FIG. 16(k)) of the RS latch 524 included in the negative data latch circuit 520 is reset to the level L by the pulse signal of the output Q512.

In the cycle starting from the time point t12, the positive data signal RD0 falls to the level L, while the negative data signal ZRD0 is kept at the level H. The output Q512 of the NAND gate 512 included in the positive data latch circuit 510 has no pulse but is kept at the level H. The output Q522 of the NAND gate 522 included in the negative data latch circuit 520 is, on the other hand, a pulse signal that falls synchronously with the latch signal RDLT. The output Q524 of the RS latch 524 in the negative data latch circuit 520 is set at the level H by the pulse signal of the output Q522. The output Q514 of the RS latch 514 in the positive data latch circuit 510 is reset to the level L by the pulse signal of the output Q512.

In each cycle, while the preset signal PSET is at the level H (in a time period between time points t111 and t112 and a time period between time points t121 and t122) and while the output execution signal OEM is at the level L (in a time period between time points t111 and t113 and a time period between time points t12 and t123), there is restriction of outputs from the 3-input NAND gate 516 of the positive data latch circuit 510 and the 3-input NAND gate 526 of the negative data latch circuit 520. The output Q510 of the positive data latch circuit 510 is accordingly fixed to the level L, whereas the output Q520 of the negative data latch circuit 520 is fixed to the level H. Namely the output Q510 of the positive data latch circuit 510 and the output Q520 of the negative data latch circuit 520 are reversed phase signals.

While the preset signal PSET is at the level L and the output execution signal OEM is at the level H (in a time period between time points t113 and t12 and a time period between time points t123 and t13), the output Q514 of the RS latch 514 is given as the output Q510 (FIG. 16(l)) of the positive data latch circuit 510. An inverted signal of the output Q524 of the RS latch 524 is given as the output Q520 (FIG. 16(m)) of the negative data latch circuit 520. The output Q510 of the positive data latch circuit 510 is thus substantially equal to the output Q520 of the negative data latch circuit 520. Namely the outputs Q510 and Q520 are in-phase signals.

The output drive circuit 530 shown in FIG. 19 has two inverters 532 and 534 and an output inverter 536. The first inverter 532 receives the output Q510, whereas the second inverter 534 receives the output Q520.

The first inverter 532 is a CMOS inverter having a pMOS (p channel MOS) transistor 532P grounded to a positive power source VDD and an nMOS (n channel MOS) transistor 532N grounded to a negative power source VSS. The first inverter 532 is also provided with a pMOS transistor 532G, which is interposed between the output of the pMOS transistor 532P and the output of the nMOS transistor 532N and functions as a gate transistor for connecting and disconnecting the outputs with each other and from each other. A gate terminal of the gate transistor 532G receives an output Q544 of a NOR gate 544.

The second inverter 534 is a CMOS inverter having a pMOS transistor 534P grounded to the positive power source VDD and an nMOS transistor 534N grounded to the negative power source VSS. The second inverter 534 is also provided with an nMOS transistor 534G, which is interposed between the output of the pMOS transistor 534P and the output of the nMOS transistor 534N and functions as a gate transistor. A gate terminal of the gate transistor 534G receives an output Q546 of a NAND gate 546.

When the preset signal PSET is at the level L, the output execution signal OEM is at the level H, and the output Q510 of the positive data latch circuit 510 and the output W520 of the negative data latch circuit 520 are the in-phase signals, the output drive circuit 530 sets the signal level of the output data signal DO0 equivalent to the level of the outputs Q510 and Q520.

The preset circuit 540 shown in FIG. 19 includes an inverter 542, the NOR gate 544, the NAND gate 546, two nMOS transistors 548 and 536N, and two pMOS transistors 549 and 536P. The nMOS transistor 536N and the pMOS transistor 536P are also the constituents of the output inverter 536 in the output drive circuit 530. In the description hereinafter, the nMOS transistor 536N and the pMOS transistor 536P may be referred to as the 'output transistors 536N and 536P'. The nMOS transistor 548 and the pMOS transistor 549 are used to preset the output DO0. In the description hereinafter, the nMOS transistor 548 and the pMOS transistor 549 may be referred to as the 'preset transistors 548 and 549'.

Inputs of the NOR gate 544 are the preset signal PSET inverted by the inverter 542 and the output data signal DO0. Inputs of the NAND gate 546 are the preset signal PSET and the output data signal DO0. The output Q544 of the NOR gate 544 is input into a gate terminal of the nMOS transistor 548, as well as into the gate terminal of the gate transistor 532G included in the first inverter 532 of the output drive circuit 530 as explained above. The output Q546 of the NAND gate 546 is input into a gate terminal of the pMOS transistor 549, as well as into the gate terminal of the gate transistor 534G included in the second inverter 534 of the output drive circuit 530 as explained above.

The nMOS transistor 548 is interposed between the output Q532 of the inverter 532 and the output DO0 of the output drive circuit 530. The pMOS transistor 549 is interposed between the inverter 534 and the output DO0.

Figure 21:
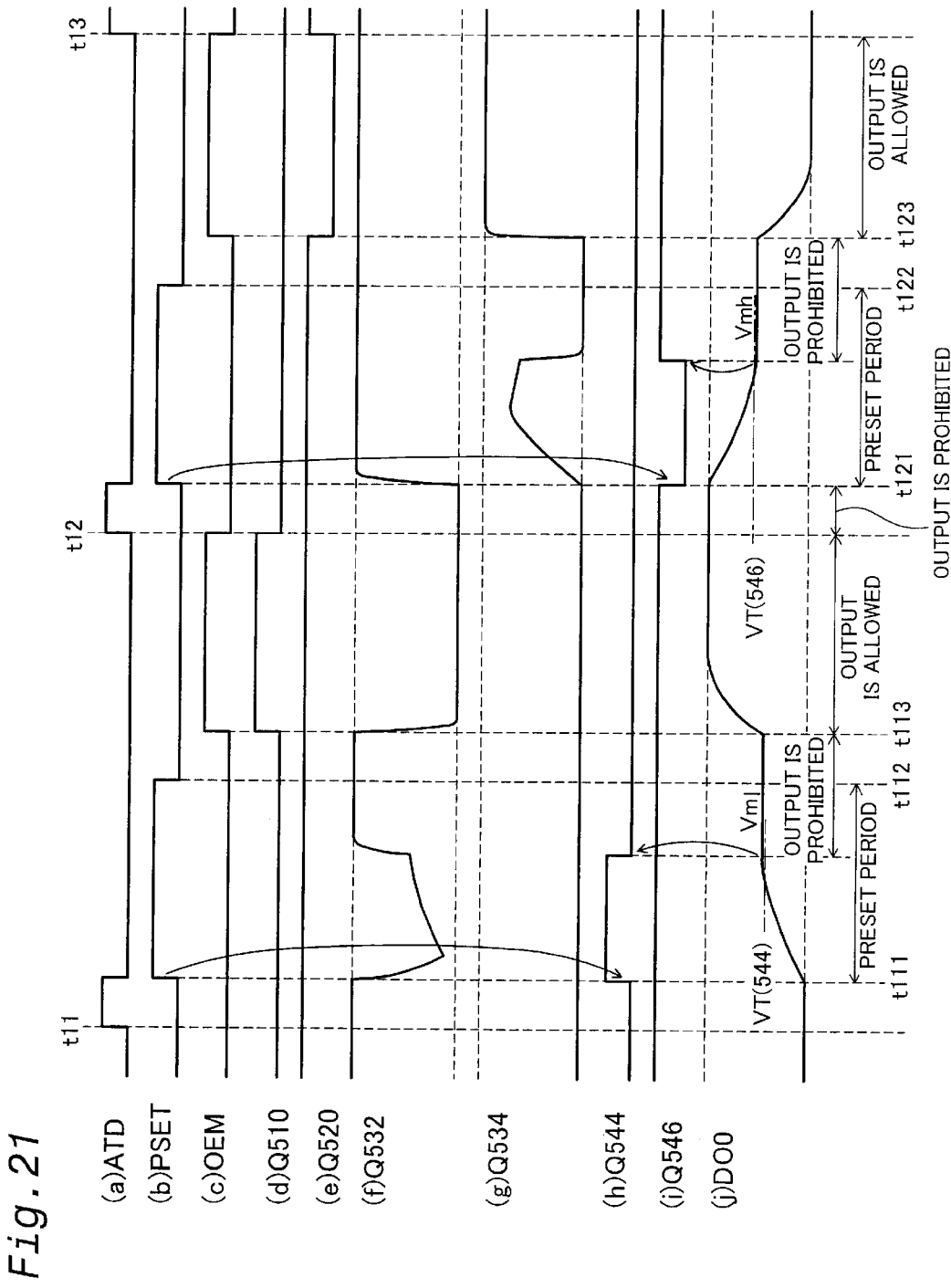
FIG. 21 is a timing chart showing the operations of the preset circuit 540 and the output drive circuit 530 in the output circuit 14EX0 in the read operation cycles of FIG. 20.

FIG. 21 is a timing chart showing the operations of the preset circuit 540 and the output drive circuit 530 in the output circuit 14EX0 in the read operation cycles of FIG. 20. FIGS. 21(a) through 21(e) are identical with FIGS. 20(a), 20(c), 20(d), 20(l), and 20(m), respectively.

At the time point t11, the output execution signal OEM (FIG. 21(c)) is at the level L (inactive), and the preset signal PSET (FIG. 21(b)) is at the level L (inactive). When the output execution signal OEM is at the level L, the output Q510 and the output Q520 are respectively fixed to the level L and to the level H, as described previously.

When the preset signal PSET is at the level L, the output Q544 (FIG. 21(h)) of the NOR gate 544 included in the preset circuit 540 (FIG. 19) is set at the level L, while the output Q546 (FIG. 21(i)) of the NAND gate 546 is kept at the level H irrespective of the level of the output DO0. In the case where the output Q544 is at the level L, the gate transistor 532G of the first inverter 532 is ON, so that the output Q532 (FIG. 21(f)) of the first inverter 532 is set at the level H. In the case where the output Q546 is at the level H, the gate transistor 534G of the second inverter 534 is ON, so that the output Q534 (FIG. 21(g)) of the second inverter 534 is set at the level L. Since the output Q532 is at the level H and the output Q534 is at the level L, both of the pMOS transistor 536P and the nMOS transistor 536N of the output inverter 536 are OFF. The output DO0 accordingly falls into the floating state and substantially keeps the previous level immediately before the floating state. It is here assumed that the output DO0 (FIG. 21(j)) is at the level L.

When the preset signal PSET rises to the level H at the time point t111, the output Q544 changes to the level H. The output Q546 is kept at the level H and the output Q534 is kept at the level L, since the output DO0 is at the level L. As the output Q546 is at the level H, the preset (pMOS) transistor 549 is OFF.

In the case where the output Q544 is at the level H, the gate transistor 532G of the first inverter 532 is OFF for interruption, while the preset (nMOS) transistor 548 is ON. The ON state of the preset transistor 548 causes electric current to run from the output Q532 to the output DO0, thus lowering the level of the output Q532 and heightening the level of the output DO0. The decrease in level of the output W532 to a specific transistor-ON value turns the output transistor 536P ON. The electric current then runs from the power source VDD to further raise the level of the output DO0. When a level Vml of the output DO0 becomes greater than an input transition level VT(544) of the NOR gate 544, the output Q544 of the NOR gate Q544 falls to the level L.

The fall of the output Q544 to the level L turns the preset transistor 548 OFF to conclude the charge of the output DO0. The gate transistor 532G of the first inverter 532 is ON, and the first inverter 532 starts inversion. While the first inverter 532 starts inversion, the preset signal is kept at the level H during a preset period until the time point t112. The output Q532 is accordingly fixed to the level H. Like the time period between the time points t11 and t111, the output DO0 falls into the floating state (when output is forbidden) and substantially keeps the previous level Vml. In the case where the input transition level VT(544) of the NOR gate 544 is equal to an intermediate potential Vm between the level L and the level H, the level Vml of the output DO0 is set practically equal to the intermediate potential Vm. The potential Vml may be referred to as the 'preset potential Vml'.

At the time point t112, the preset period is terminated, and the preset signal PSET falls to the level L. In the time period until the time point t113, the output execution signal OEM is kept at the level L. Like the time period between the time points t111 and t111, the output DO0 is still in the floating state and substantially keeps the previous level, that is, the preset potential Vml.

When the output execution signal OEM changes to the level H at the time point t113, the output Q510 (FIG. 21(d)) of the positive data latch circuit 510 and the output Q520 (FIG. 21(e)) of the negative data latch circuit 520 have a practically equal logic level according to the positive data signal RD0 and the negative data signal ZRD0 as described previously, and are set at the level H. The outputs Q532 and Q534 of the first and the second inverters 532 and 534 are inverted signals of the outputs Q510 and Q520, so that the outputs Q532 and Q534 have a practically equal logic level, which is the level L in the illustrated example.

The output inverter 536 has the pMOS transistor 536P grounded to the positive power source VDD and the nMOS transistor 536N grounded to the negative power source. The signals input into the respective gates of the transistors 536P and 536N are the outputs Q532 and Q534 having substantially the same logic level. The output inverter 536 thus effectively functions as a CMOS inverter. As shown in FIGS. 20(d) and 20(e), when the positive data signal RD0 is at the level H, the negative data signal ZRD0 is at the level L, and the outputs Q510 and Q520 are at the level H, the outputs Q532 and Q534 are at the level L and the output DO0 of the output inverter 536 is at the level H (the value '1'). When the positive data signal RD0 is at the level L, the negative data signal ZRD0 is at the level H, and the outputs Q510 and Q520 are at the level L, on the other hand, the outputs Q532 and Q534 are at the level H and the output DO0 of the output inverter 536 is at the level L (the value '0').

As in the time period between the time points t11 and t111, the output DO0 is in the floating state and keeps the state of the time point t12, that is, the level H, in the time period between the time points t12 and t121.

When the preset signal PSET rises to the level H at the time point t121, the output Q546 is changed to the level L. As the output DO0 is at the level H, the output Q544 is kept at the level L. The output Q532 rises to the level H in response to the output Q510. The preset transistor 548 is OFF, since the output Q544 is at the level L.

When the output Q546 is at the level L, the gate transistor 534G of the second inverter 534 is OFF for interruption, and the preset transistor 549 is ON. The ON state of the preset transistor 549 causes electric current to run from the output DO0 to the output Q534, thus heightening the level of the output Q534 and lowering the level of the output DO0. The increase in level of the output Q534 to a specific transistor-ON value turns the output transistor 536N ON. The electric current then runs from the output DO0 to the power source VSS to further lower the level of the output DO0. When a level Vmh of the output DO0 becomes greater than an input transition level VT(546) of the NAND gate 546, the output Q546 of the NAND gate Q546 rises to the level H.

The rise of the output Q546 to the level H turns the preset transistor 549 OFF to conclude the discharge of the output DO0. The gate transistor 534G of the second inverter 534 is ON, and the second inverter 534 starts inversion. As in the case of the first inverter 532, while the second inverter 534 starts inversion, the preset signal is kept at the level H during the preset period until the time point t122. The output Q534 is accordingly fixed to the level L and the output Q532 is fixed to the level H. At this moment, the output DO0 falls into the floating state (time period when output is forbidden) and substantially keeps the previous level Vmh. In the case where the input transition level VT(546) of the NAND gate 546 is equal to the intermediate potential Vm between the level L and the level H, the level Vmh of the output DO0 is set practically equal to the intermediate potential Vm. The potential Vmh may be referred to as the 'preset potential Vmh'.

It is preferable that the input transition level VT(544) of the NOR gate 544 and the input transition level VT(546) of the NAND gate 546 hold the relations of VT(544)<VT(546) and VT(546)−VT(544)<0.2 to 0.3 V. If VT(546)≦VT(544), the operation starting from the time point t111 and the operation starting from the time point t121 in FIG. 21 may be unstable and repeated in one identical preset period. The input transition level VT(544) is typically set in a range of (Vm−0.15) V to (Vm−0.1) V. The input transition level VT(546) is set in a range of (Vm+0.1) V to (Vm+0.15) V.

At the time point t122, the preset period is terminated, and the preset signal PSET falls to the level L. In the time period until the time point t123, the output execution signal OEM is kept at the level L. In this case, as described above, the output DO0 is still in the floating state and substantially keeps the previous level, that is, the preset potential Vmh.

When the output execution signal OEM changes to the level H at the time point t123, the output Q510 (FIG. 21(d)) of the positive data latch circuit 510 and the output Q520 (FIG. 21(e)) of the negative data latch circuit 520 are set at the level L as described above. The outputs Q532 and Q534 of the first and the second inverters 532 and 534 have a practically equal logic level, which is the level H in the illustrated example.

As shown in FIGS. 20(d) and 20(e), when the positive data signal RD0 is at the level L, the negative data signal ZRD0 is at the level H, and the outputs Q510 and Q520 are at the level L, the outputs Q532 and Q534 are at the level H and the output DO0 of the output inverter 536 is at the level L (the value '0'). When the positive data signal RD0 is at the level H, the negative data signal ZRD0 is at the level L, and the outputs Q510 and Q520 are at the level H, on the other hand, the outputs Q532 and Q534 are at the level L and the output DO0 of the output inverter 536 is at the level H (the value '1').

In the preset period, the output DO0 is set equal to the preset level Vml or the preset level Vmh, which is substantially equal to the intermediate potential Vm, according to the potential level of the output DO0 immediately before the start of the preset period. The output DO0 changes to the level H or the level L from the preset level Vml or Vmh, in response to a rise of the output execution signal OEM to the level H. The output DO0 accordingly has a smaller variation, compared with the variation in output DO0 from the level L to the level H or from the level H to the level L. This reduces the variation in electric current flowing to the power source VDD or VSS, which depends upon the variation in output DO0, thus effectively preventing the potential noise in the power source VDD or VSS due to the variation in electric current.

Especially in the case where the preset level Vml or Vmh is set substantially equal to the intermediate potential Vm, the variation in output DO0 is almost half the variation from the level H to the level L or the variation from the level L to the level H. This further effectively prevents the potential noise.

As described above, in the memory chip 200 of this embodiment, before the reading data are output from the input-output data terminals IO0 through IO15 in the read operation, the outputs DO0 through DO15, that is, the signal levels of the input-output data terminals IO0 through IO15 are set equal to the preset level Vml or Vmh between the level H and the level L. This effectively prevents the potential noise in the power source VDD or VSS.

In the arrangement of this embodiment, the preset signal PSET is output, not in response to the external access execution signals #EX0 through #EX3 but in response to the column access signal #BE that is activated in each cycle. The outputs DO0 through DO15, that is, the signal levels of the input-output data terminals IO0 through IO15 are accordingly set to the preset level Vml or Vmh even in the operations where the external access execution signals #EX0 through #EX3 are not activated in each cycle, as in the case of page mode access.

As clearly understood from the above description, the output control circuit 150 corresponds to the preset control circuit of the present invention.

B. Second Embodiment

Figure 22:
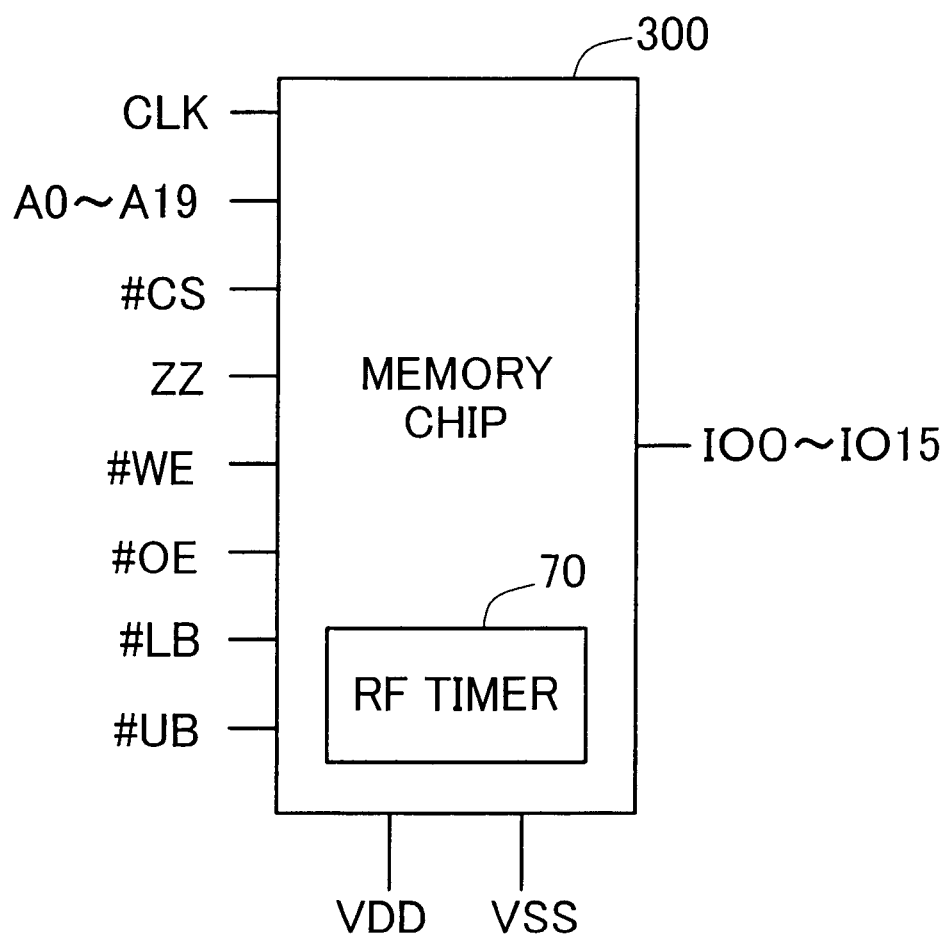
FIG. 22 illustrates the terminal structure of a memory chip 300 in a second embodiment of the present invention.

FIG. 22 illustrates the terminal structure of a memory chip 300 in a second embodiment of the present invention. This memory chip 300 has a clock input terminal CLK for input of an external clock signal CLK and allows burst mode access.

Figure 23:
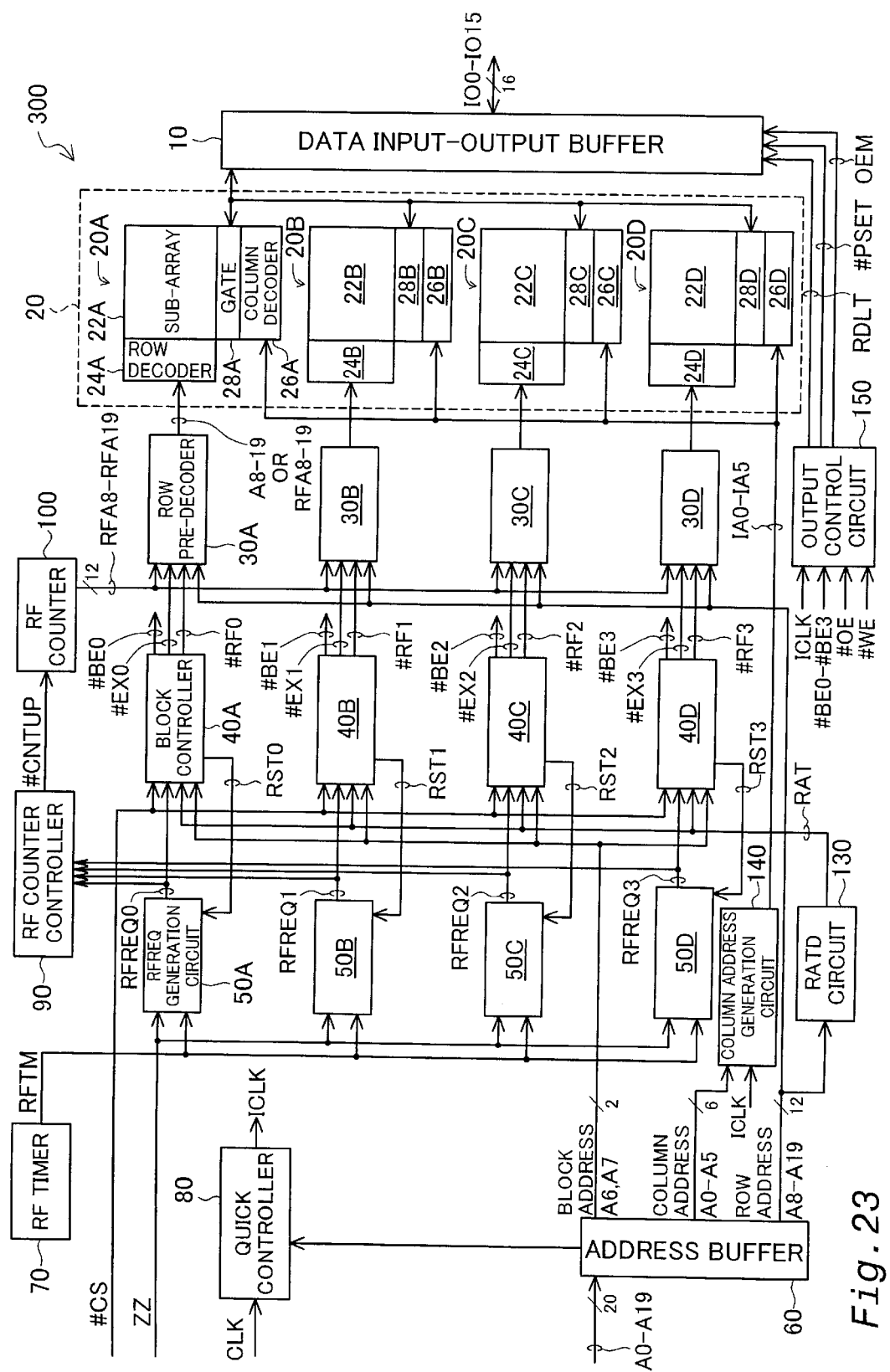
FIG. 23 is a block diagram illustrating the internal structure of the memory chip 300.

FIG. 23 is a block diagram illustrating the internal structure of the memory chip 300. This memory chip 300 has a clock controller 80, in place of the ATD circuit in the memory chip 200 shown in FIG. 4, and a column address generation circuit 140. The other circuit elements are identical with those of the memory chip 300.

In response to input of a new address A0 through A19 from an external device to start burst mode access, the clock controller 80 generates an internal clock signal ICLK from the clock signal CLK input from the external device. The internal clock signal ICLK is given to the other circuit elements in the memory chip 300, instead of the ATD signal.

The column address generation circuit 140 sets a column address A0 through A5 at the time of starting the burst mode access as the initial address and carries out counting-up or counting-down with the clock signal ICLK as the clock to generate an internal column address IA0 through IA5. The internal column address IA0 through IA5 is supplied to the column decoders 26A through 26D as the actual column address.

Figure 24:
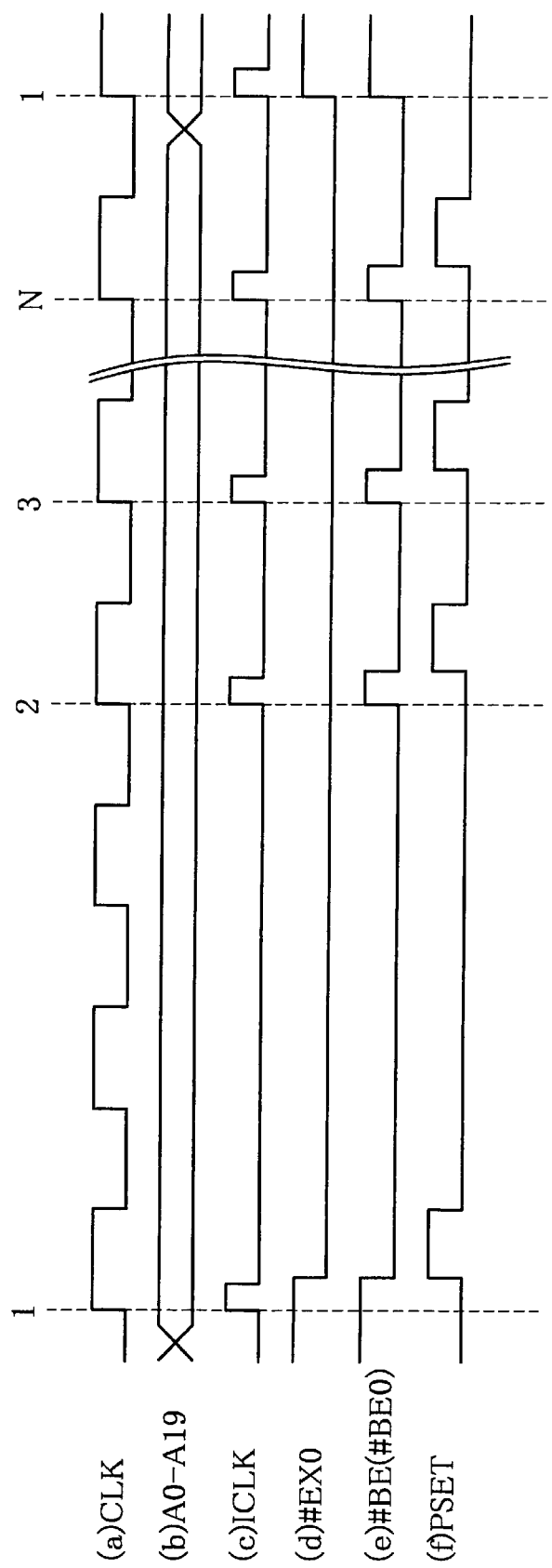
FIG. 24 is a timing chart of a preset signal PSET in the case of read operation by burst mode access.

FIG. 24 is a timing chart of the preset signal PSET in the case of read operation by the burst mode access. In response to input of an address A0 through A19 (FIG. 24(b)) to start the burst access mode, the internal clock signal ICLK (FIG. 24(c)) synchronous with the clock signal CLK is generated. The internal clock signal ICLK outputs clocks at certain periods equal to a preset value N (where N represents the number of cycles accessible by one burst mode access). The first cycle has a period 3 times the period of the clock signal CLK, for activation of the word line. The second through the N-th cycles have a period identical with the period of the clock signal CLK. The internal clock signal ICLK has a significantly smaller duty. For example, while the external clock signal CLK has a duty of about 50%, the internal clock signal ICLK has a duty of about 3%. Namely the state of 'synchronous with the internal clock signal ICLK' means the state of synchronous with the external clock signal CLK.

As in the case of page mode access, the block address A6 and A7 and the row address A8 through A19 are fixed and unchanged in the burst mode access. Only the external access execution signal of the selected block specified by the block address A6 and A7, among the external access execution signals #EX0 through #EX3 of the respective blocks, is accordingly set at the level L (active). In the illustrated example, the external access execution signal #EX0 is set at the level L (active) as shown in FIG. 24(d). Because of the fixed row address A8 through A19, the external access execution signal #EX0 is kept at the level L (active) in each cycle, as in the case of the page mode access explained in the first embodiment.

The column access enable signal #BE0 of the selected block changes to the level L (active) in each cycle, and the column access signal #BE (FIG. 24(e)) accordingly changes to the level L (active) in each cycle. The fall of the column access signal #BE to the level L (active) causes the preset signal PSET (FIG. 24(f)) to be kept at the level H (active) for a specified period.

As described above, in the arrangement of this embodiment, the preset signal is output, not in response to the external access execution signals #EX0 through #EX3 but in response to the column access signal #BE that is activated in each cycle. The outputs DO0 through DO15 are accordingly preset even in the operations where the external access execution signals #EX0 through #EX3 are not set at the level L (active) in each cycle, as in the case of burst mode access. This reduces the variation in output level, thus effectively preventing the potential noise due to a variation in electric current, which depends upon the variation in output level.

C. Application to Electronic Apparatuses

Figure 25:
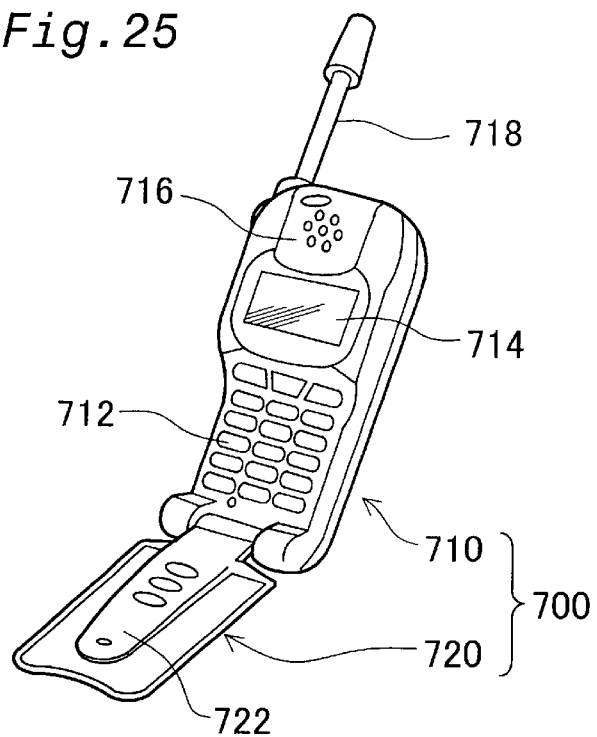
FIG. 25 is a perspective view illustrating a cellular phone as one embodiment of electronic apparatus utilizing a semiconductor memory device of the present invention.

FIG. 25 is a perspective view illustrating a cellular phone as one embodiment of electronic apparatus utilizing a semiconductor memory device of the present invention. The cellular phone 700 has a main body 710 and a cover member 720. The main body 710 has a keyboard 712, a liquid crystal display 714, a receiver module 716, and an aerial module 718. The cover member 720 has a microphone module 722.

Figure 26:
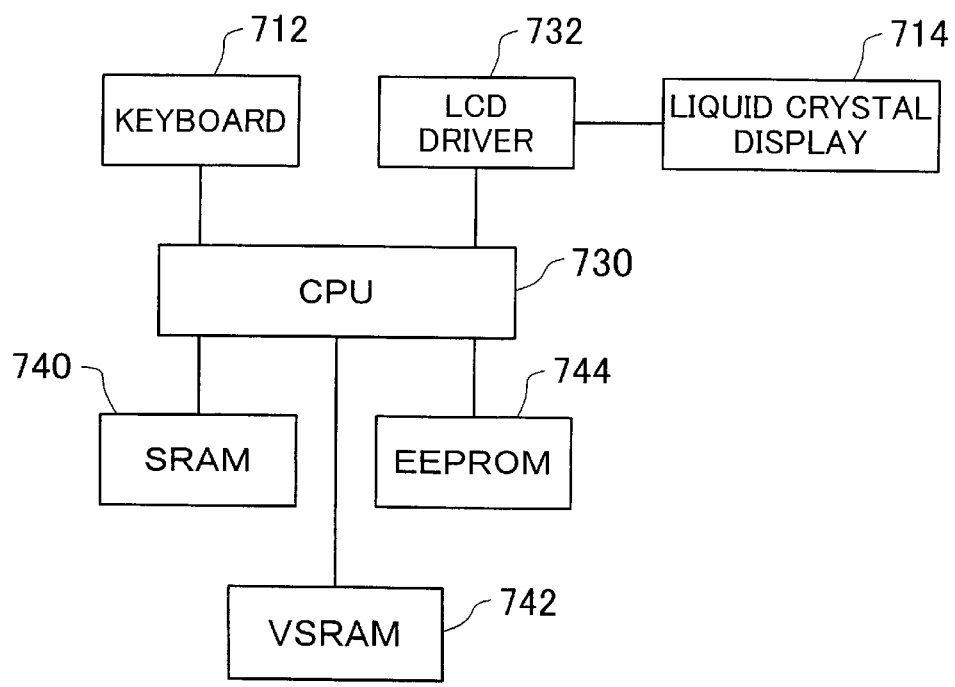
FIG. 26 is a block diagram illustrating the electrical construction of the cellular phone 700 of FIG. 25.

FIG. 26 is a block diagram illustrating the electrical construction of the cellular phone 700 of FIG. 25. A CPU 730 is connected to the keyboard 712, an LCD driver 732 for actuating the liquid crystal display 714, an SRAM 740, a VSRAM 742, and an EEPROM 744 via bus lines.

The SRAM 740 is used, for example, as a high-speed cache memory. The VSRAM 742 is used, for example, as a working memory for image processing. The memory chip 200 described above is applicable for the VSRAM (virtual SRAM) 742. The EEPROM 744 is used to store various settings of the cellular phone 700.

The VSRAM 742 is kept in the snooze state to pause the operations of the cellular phone 700. In this state, the VSRAM 742 automatically carries out internal refresh, so that data in the VSRAM 742 can be held. The memory chip 200 of the embodiment has a relatively large capacity and thus advantageously holds a mass of data, such as image data, for a long time period.

The above embodiments and their application are to be considered in all aspects as illustrative and not restrictive. There may be many modifications, changes, and alterations without departing from the scope or spirit of the main characteristics of the present invention. Some examples of possible modification are given below.

In the above embodiments, the memory cell array 20 is divided into the four blocks 20A through 20D. The memory cell array 20 may, however, be treated as one block. In the latter case, the word line activation control module is required to have one row pre-decoder, one block controller, and one refresh requirement signal generation circuit, while the structure of FIG. 4 has the row pre-decoders 30A through 30D, the block controllers 40A through 40D, and the refresh requirement signal generation circuits 50A through 50D provided in the respective blocks. In this case, the address does not include the block address, but has only the row address and the column address.

In the case where the memory cell array 20 is treated as one block, the word line activation control module activates, in response to a requirement of external access, a selected word line specified by the row address in the block, and keeps the active word line until a change of the row address out of the address used in a subsequent cycle. In the case where a different column address is set in a subsequent cycle where an address including the same row address is used, external access is executed to a different memory cell on the active word line. The output buffer is then preset in each cycle.

In general, in multiple consecutive operation cycles where addresses including an identical row address are used, the word line activation control module is required to keep the active state of the word line activated in the first consecutive cycle to the last consecutive cycle without inactivation. When the refreshing operation is to be carried out in a cycle after the first consecutive cycle but before the last consecutive cycle, the word line activation control module is required to inactivate the active word line prior to the refreshing operation.

What is claimed is:

1. A semiconductor memory device, comprising:
   at least one memory cell block including dynamic memory cells arrayed in a matrix;
   a row address decoder and a column address decoder that select a memory cell in the memory cell block, which is specified by an address including a row address and a column address;
   an output buffer that outputs data corresponding to the selected memory cell specified by the address;
   a preset circuit that presets an output level of the output buffer; and
   a preset control module that controls an operation of the preset circuit,
   wherein the preset control module actuates the preset circuit to preset the output level of the output buffer prior to output of the data corresponding to the selected memory cell from the output buffer, at every output of the data corresponding to the memory cell selected by the column address decoder.

2. A semiconductor memory device in accordance with claim 1, wherein the preset control module actuates the preset circuit to preset the output level of the output buffer in response to every change of the column address in a consecutive output mode where the row address is fixed and the column address is varied.

3. A semiconductor memory device in accordance with claim 1, the semiconductor memory device further comprising an output enable signal input terminal, which receives an output enable signal for defining output state from the output buffer,
   wherein the preset control module, in the case where the output enable signal is in an output forbid state, actuates the preset circuit to preset the output level of the output buffer after the output enable signal is set in an output enable state.

4. A semiconductor memory device in accordance with claim 1, wherein the output level of the output buffer is preset by the preset circuit to a substantially intermediate level between a level representing data '1' and a level representing data '0'.

5. A semiconductor memory device in accordance with claim 1, the semiconductor memory device further comprising:
   multiple memory cell blocks, and multiple row address decoders and column address decoders, which correspond to the respective memory cell blocks,
   wherein the address includes a block address for selecting one arbitrary memory cell block among the multiple memory cell blocks, and
   the preset control module actuates the preset circuit to preset the output level of the output buffer prior to output of the data corresponding to the selected memory cell from the output buffer, at every output of the data corresponding to the memory cell selected by the column address decoder in one memory cell block specified by the block address.

6. A semiconductor memory device in accordance with claim 1, the semiconductor memory device being provided with a pair of power source terminals, one positive power source terminal and one negative power source terminal, as only power supply terminals for supplying power to the semiconductor memory device.

7. A semiconductor memory device in accordance with claim 2, the semiconductor memory device further comprising an output enable signal input terminal, which receives an output enable signal for defining output state from the output buffer, wherein the preset control module, in the case where the output enable signal is in an output forbid state, actuates the preset circuit to preset the output level of the output buffer after the output enable signal is set in an output enable state.

8. A semiconductor memory device in accordance with claim 2, wherein the output level of the output buffer is preset by the preset circuit to a substantially intermediate level between a level representing data '1' and a level representing data '0'.

9. A semiconductor memory device in accordance with claim 2, the semiconductor memory device further comprising:

multiple memory cell blocks, and multiple row address decoders and column address decoders, which correspond to the respective memory cell blocks, wherein the address includes a block address for selecting one arbitrary memory cell block among the multiple memory cell blocks, and the preset control module actuates the preset circuit to preset the output level of the output buffer prior to output of the data corresponding to the selected memory cell from the output buffer, at every output of the data corresponding to the memory cell selected by the column address decoder in one memory cell block specified by the block address.

10. A semiconductor memory device in accordance with claim 2, the semiconductor memory device being provided with a pair of power source terminals, one positive power source terminal and one negative power source terminal, as only power supply terminals for supplying power to the semiconductor memory device.

11. A semiconductor memory device in accordance with claim 3, wherein the output level of the output buffer is preset by the preset circuit to a substantially intermediate level between a level representing data '1' and a level representing data '0'.

12. A semiconductor memory device in accordance with claim 3, the semiconductor memory device further comprising:

multiple memory cell blocks, and multiple row address decoders and column address decoders, which correspond to the respective memory cell blocks, wherein the address includes a block address for selecting one arbitrary memory cell block among the multiple memory cell blocks, and the preset control module actuates the preset circuit to preset the output level of the output buffer prior to output of the data corresponding to the selected memory cell from the output buffer, at every output of the data corresponding to the memory cell selected by the column address decoder in one memory cell block specified by the block address.

13. A semiconductor memory device in accordance with claim 3, the semiconductor memory device being provided with a pair of power source terminals, one positive power source terminal and one negative power source terminal, as only power supply terminals for supplying power to the semiconductor memory device.

14. A semiconductor memory device in accordance with claim 4, the semiconductor memory device further comprising:

multiple memory cell blocks, and multiple row address decoders and column address decoders, which correspond to the respective memory cell blocks, wherein the address includes a block address for selecting one arbitrary memory cell block among the multiple memory cell blocks, and the preset control module actuates the preset circuit to preset the output level of the output buffer prior to output of the data corresponding to the selected memory cell from the output buffer, at every output of the data corresponding to the memory cell selected by the column address decoder in one memory cell block specified by the block address.

15. A semiconductor memory device in accordance with claim 4, the semiconductor memory device being provided with a pair of power source terminals, one positive power source terminal and one negative power source terminal, as only power supply terminals for supplying power to the semiconductor memory device.

16. A semiconductor memory device in accordance with claim 5, the semiconductor memory device being provided with a pair of power source terminals, one positive power source terminal and one negative power source terminal, as only power supply terminals for supplying power to the semiconductor memory device.

17. A method of presetting an output level of an output buffer in a semiconductor memory device, the semiconductor memory device comprising: at least one memory cell block including dynamic memory cells arrayed in a matrix; a row address decoder and a column address decoder that select a memory cell in the memory cell block, which is specified by an address including a row address and a column address; the output buffer that outputs a data corresponding to the selected memory cell specified by the address; and a preset circuit that presets the output level of the output buffer, the method comprising the step of:
actuating the preset circuit to preset the output level of the output buffer prior to output of the data corresponding to the selected memory cell from the output buffer, at every output of the data corresponding to the memory cell selected by the column address decoder.

* * * * *